United States Patent
Xi et al.

(10) Patent No.: US 11,056,437 B2
(45) Date of Patent: Jul. 6, 2021

(54) PANEL-LEVEL CHIP DEVICE AND PACKAGING METHOD THEREOF

(71) Applicant: Shanghai AVIC OPTO Electronics Co., Ltd., Shanghai (CN)

(72) Inventors: Kerui Xi, Shanghai (CN); Feng Qin, Shanghai (CN); Jine Liu, Shanghai (CN); Xiaohe Li, Shanghai (CN); Tingting Cui, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 32 days.

(21) Appl. No.: 16/457,290

(22) Filed: Jun. 28, 2019

(65) Prior Publication Data

US 2020/0328159 A1    Oct. 15, 2020

(30) Foreign Application Priority Data

Apr. 9, 2019    (CN) .......................... 201910279730.2

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC . H01L 2224/12105; H01L 2224/04105; H01L 2224/92244; H01L 2224/32225;
(Continued)

(56) References Cited

U.S. PATENT DOCUMENTS

2014/0291844 A1* 10/2014 Ryu ..................... H01L 24/96
257/738
2016/0218063 A1* 7/2016 Tsai ................... H01L 23/3171
(Continued)

FOREIGN PATENT DOCUMENTS

| CN | 103794587 A | 5/2014 |
|---|---|---|
| CN | 103887279 A | 6/2014 |

(Continued)

*Primary Examiner* — Caleen O Sullivan
(74) *Attorney, Agent, or Firm* — Anova Law Group PLLC

(57) ABSTRACT

A panel-level chip device and a packaging method for forming the panel-level chip device are provided. The panel-level chip device includes a plurality of first bare chips disposed on a supporting base, and a plurality of first connection pillars. The panel-level chip device also includes a first encapsulation layer, and a first redistribution layer. The first redistribution layer includes a plurality of first redistribution elements and a plurality of second redistribution elements. Further, the panel-level chip device includes a solder ball group including a plurality of first solder balls. First connection pillars having a same electrical signal are electrically connected to each other by a first redistribution element. Each of remaining first connection pillars is electrically connected to one second redistribution element. The one second redistribution element is further electrically connected to a first solder ball of the plurality of first solder balls.

10 Claims, 19 Drawing Sheets

(51) Int. Cl.
*H01L 23/544* (2006.01)
*H01L 23/00* (2006.01)
*H01L 21/48* (2006.01)
*H01L 21/56* (2006.01)

(52) U.S. Cl.
CPC .......... *H01L 21/565* (2013.01); *H01L 21/568* (2013.01); *H01L 23/3128* (2013.01); *H01L 23/5383* (2013.01); *H01L 23/5386* (2013.01); *H01L 23/544* (2013.01); *H01L 24/19* (2013.01); *H01L 24/20* (2013.01); *H01L 2223/54426* (2013.01); *H01L 2224/214* (2013.01)

(58) Field of Classification Search
CPC ....... H01L 2224/73267; H01L 2224/18; H01L 25/0655; H01L 23/49838; H01L 23/3107; H01L 25/50; H01L 23/5389; H01L 21/4853; H01L 21/4857; H01L 21/565; H01L 21/568; H01L 23/3128; H01L 23/5383; H01L 23/5386; H01L 23/544; H01L 24/19; H01L 24/20; H01L 2223/54426; H01L 2224/214; H01L 2223/54486; H01L 2221/68377; H01L 2221/68309; H01L 21/56; H01L 2221/68372; H01L 21/6835
USPC .......................................................... 257/668
See application file for complete search history.

(56) References Cited

U.S. PATENT DOCUMENTS

2020/0294921 A1* 9/2020 Liu .................. H01L 23/5386
2020/0312772 A1* 10/2020 Xi .................... H01L 23/5386

FOREIGN PATENT DOCUMENTS

| CN | 105225965 A | 1/2016 |
| CN | 105977233 A | 9/2016 |
| CN | 106531644 A | 3/2017 |
| CN | 109216324 A | 1/2019 |

\* cited by examiner

PANEL-LEVEL CHIP DEVICE AND PACKAGING METHOD THEREOF

CROSS-REFERENCES TO RELATED APPLICATIONS

This application claims the priority of Chinese patent application No. 201910279730.2, filed on Apr. 9, 2019, the entirety of which is incorporated herein by reference.

FIELD

The present disclosure generally relates to the field of packaging technology and, more particularly, relates to a panel-level chip device and a packaging method thereof.

BACKGROUND

With the continuous development of integrated circuit technology, electronic products, e.g., a mobile phone and a computer, etc., have gradually developed in the direction of low power consumption, multi-function, and miniaturization, etc. In view of this, the current mainstream practice is to increase the integration degree of a single packaged chip as much as possible, and then to assemble the packaged chip on an external circuit, e.g., a printed circuit board, etc. Signals between the packaged chips are communicated through the circuits on the printed circuit board to enable the electronic product to implement the desired functionality. However, the electronic product has the following issues.

For the packaged chip with a high integration degree and small size, when the packaged chip is assembled on the printed circuit board by a ball placement method, a welding operation desires to be performed on each placed ball, respectively. Thus, the workload is heavy, and it is difficult to ensure the reliability of the connection between the placement ball and the printed circuit board. At the same time, due to the small spacing between the solder balls on the packaged chip, a short-circuit issue between adjacent placed balls often occurs. Therefore, a failure rate of the packaged chip is often high, and the production cost of the electronic products is substantially high.

In a case of complicated wiring on the printed circuit board, to prevent interference between the wires, the size of the printed circuit board desires to be substantially large. In view of this, the printed circuit board in the electronic product occupies a substantially large space, and certain wires have a large length. Thus, the power consumption of the electronic product is substantially high, and it is difficult for the electronic product to adapt to the low power consumption and miniaturization development demands. The disclosed panel-level chip device and packaging method are directed to solve one or more problems set forth above and other problems.

SUMMARY

One aspect of the present disclosure provides a panel-level chip device. The panel-level chip device includes a plurality of first bare chips disposed on a supporting base, and a plurality of first connection pillars disposed on a side of a first bare chip of the plurality of first bare chips away from the supporting base. The panel-level chip device also includes a first encapsulation layer, and a first redistribution layer disposed on a side of the first encapsulation layer away from the supporting base. The first encapsulation layer covers the first bare chip and the plurality of first connection pillars, and exposes a side surface of a first connection pillar of the plurality of first connection pillars away from the first bare chip. The first redistribution layer includes a plurality of first redistribution elements and a plurality of second redistribution elements. Further, the panel-level chip device includes a solder ball group disposed on a side of the first redistribution layer away from the first encapsulation layer. The solder ball group includes a plurality of first solder balls. First connection pillars in the plurality of the first connection pillars having a same electrical signal are electrically connected to each other by a first redistribution element of the plurality of first redistribution elements. Each of remaining first connection pillars in the plurality of the first connection pillars is electrically connected to one second redistribution element of the plurality of second redistribution elements. The one second redistribution element is further electrically connected to a first solder ball of the plurality of first solder balls.

Another aspect of the present disclosure provides a packaging method for forming a panel-level chip device. The packaging method includes providing a glass substrate, and forming a supporting base on a surface of the glass substrate. The packaging method also includes providing a plurality of first bare chips and attaching the plurality of first bare chips onto the supporting base. Moreover, the packaging method also includes forming a plurality of first connection pillars on a side of a first bare chip of the plurality of first bare chips away from the supporting base, and forming a first encapsulation layer, wherein the first encapsulation layer covers the first bare chip and the plurality of first connection pillars. In addition, the packaging method includes polishing the first encapsulation layer to expose a side surface of a first connection pillar of the plurality of first connection pillars away from the first bare chip, and forming a first redistribution layer on a side of the first encapsulation layer away from the supporting base. The first redistribution layer includes a plurality of first redistribution elements and a plurality of second redistribution elements. First connection pillars in the plurality of the first connection pillars having a same electrical signal are electrically connected to each other by a first redistribution element of the plurality of first redistribution elements. Each of remaining first connection pillars in the plurality of the first connection pillars is electrically connected to one second redistribution element of the plurality of second redistribution elements. Further, the packaging method includes forming a solder ball group on a side of the first redistribution layer away from the first encapsulation layer, and peeling off the glass substrate. The solder ball group includes a plurality of first solder balls, and the one second redistribution element is electrically connected to a first solder ball of the plurality of first solder balls.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE INVENTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
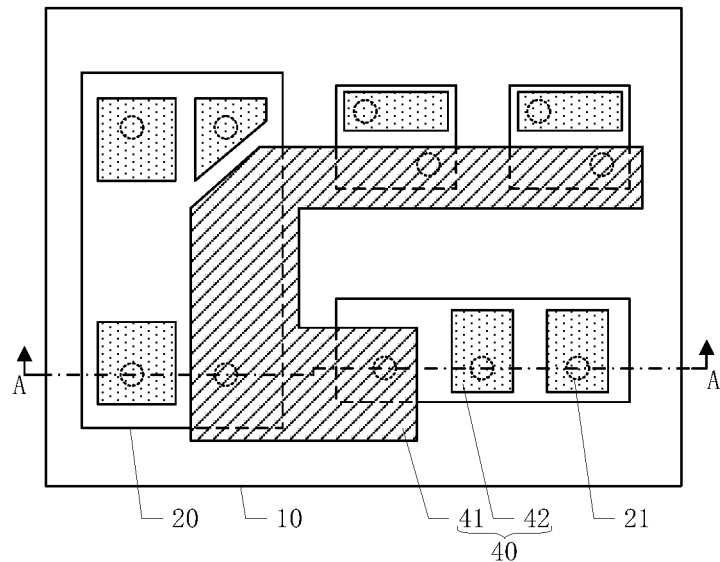
FIG. 1 illustrates a schematic top view of an exemplary panel-level chip device consistent with disclosed embodiments of the present disclosure.
Figure 2:
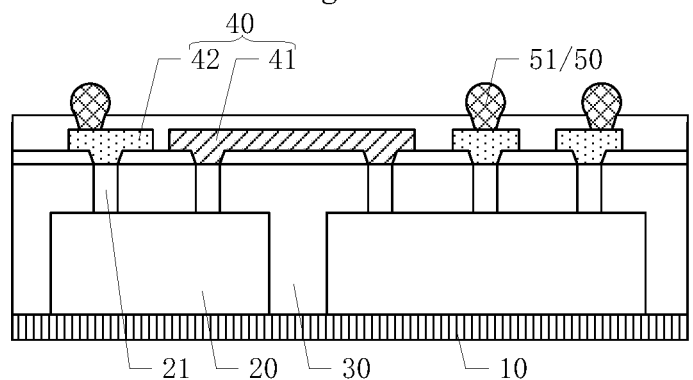
FIG. 2 illustrates a schematic A-A sectional view of an exemplary panel-level chip device in FIG. 1 consistent with disclosed embodiments of the present disclosure.

The present disclosure provides a panel-level chip device. FIG. 1 illustrates a schematic top view of a panel-level chip device consistent with disclosed embodiments of the present disclosure; and FIG. 2 illustrates a schematic A-A sectional view of the panel-level chip device in FIG. 1. Referring to FIG. 1 and FIG. 2, the panel-level chip device may include a supporting base 10; a plurality of first bare chips 20 disposed on the supporting base 10, and a first encapsulation layer 30. A plurality of first connection pillars 21 may be disposed on a side of the first bare chip 20 away from the supporting base. The first encapsulation layer 30 may cover the first bare chip 20 and the first connection pillars 21, and may expose a side surface of the first connection pillar 21 away from the first bare chip 20. The panel-level chip device may also include a first redistribution layer 40, and a solder ball group 50. The first redistribution layer 40 may be disposed on a side of the first encapsulation layer 30 away from the supporting base 10, and may include a plurality of first redistribution elements 41 and a plurality of second redistribution elements 42. The solder ball group 50 may be disposed on a side of the first redistribution layer 40 away from the first encapsulation layer 30, and may include a plurality of first solder balls 51.

The first connection pillars 21 having a same electrical signal may be electrically connected to each other by the first redistribution element 41. The remaining first connection pillars 21 may be electrically connected to the second redistribution elements 42, respectively. The second redistribution element 42 may be electrically connected to the first solder ball 51.

In one embodiment, the plurality of first bare chips 20 may be disposed on the supporting base 10. In other words, the chip device may be formed by encapsulating the first bare chips 20 on the basis of the supporting base 10. On the one hand, the first bare chips 20 and the first connection pillars 21 thereon may be covered by the first encapsulation layer 30. In view of this, the first encapsulation layer 30 and the supporting base 10 may jointly protect the first bare chips 20 and the first connection pillars 21, thereby effectively preventing external factors, e.g., water and oxygen, etc., from affecting the electrical performance of the chip device. On the other hand, a panel-level packaging process may be performed on the plurality of first bare chips 20 through the supporting base 10. Compared to the currently commonly used wafer-level packaging process, the panel-level packaging process may not only effectively improve the integration degree of the chip device and the space utilization rate of the supporting base 10, but also eliminate the post injection molding process, and, thus, the packaging efficiency of the chip device may be substantially high.

The first encapsulation layer 30 may be made of a material having desired sealing property and easy molding packaging property, e.g., epoxy molding compound (EMC), etc. Thus, a molding packaging process may be directly used to cover the first bare chips 20 and the first connection pillars 21, which may facilitate reducing the packaging difficulty of the chip device and improving the packaging efficiency.

A quantity of the first bare chips 20 may be determined according to practical applications. To enable the chip device to implement desired one or more functions, the plurality of first bare chips 20 together may be disposed on the supporting base 10 to improve the integration degree of the chip device. For illustrative purposes, FIG. 1 illustrates three first bare chips 20 as an example. The size of each first bare chip 20 may be the same or different, and the function of each first bare chip 20 may be the same or different, which are not limited by the present disclosure.

The first encapsulation layer 30 may expose the side surface of the first connection pillar 21 away from the first bare chip 20, and, thus, the first connection pillar 21 and the first redistribution layer 40 may have a desired electrical connection. The first connection pillar 21 may be made of a material including but not limited to at least one of copper, silver, nickel, gold and alloys thereof, and may have a single-layer or a multi-layer structure. When the first connection pillar 21 has a single-layer structure, the first connection pillar 21 may be made of any one of copper, silver, nickel, gold and alloys thereof. When the first connection pillar 21 has a multi-layer structure, the first connection pillar 21 may be made of two or more stacked materials of copper, silver, nickel, gold and alloys thereof.

The first redistribution layer 40 may be disposed on the side of the first encapsulation layer 30 away from the supporting base 10, and, thus, leads of the first connection pillars 21 may be fanned out through the first redistribution layer 40, such that the wire layout may be substantially flexible and convenient. In one embodiment, in the first redistribution layer 40, the first redistribution element 41 may be mainly used for electrically connecting the first connection pillars 21 having the same electrical signal to each other. In other words, the leads of the first connection pillars 21 may be directly packaged in the chip device and may not have to be led out through the first solder ball 51. In view of this, the quantity of the first solder balls 51 may be reduced, and the assembly difficulty between the chip device and an external circuit, e.g., a printed circuit board (PCB), etc., may be reduced.

Because the first redistribution element 41 is disposed inside the chip device, a length of the first redistribution element 41 may be substantially small, which may facilitate reducing the power consumption of the chip device and reducing the layout complexity of the external wires. In view of this, the space occupied by the external wires in the electronic product may be effectively reduced, which may enable the electronic product to be developed toward miniaturization and low power consumption. The quantity of the first redistribution elements 41 may be determined according to practical applications. For illustrative purposes, FIG. 1 merely illustrates one first redistribution element 41 as an example.

The second redistribution elements 42 may be mainly used to electrically connect the remaining first connection pillars 21 and the first solder balls 51, respectively. In other words, the first connection pillar 21 may be led out through the first solder ball 51 to implement the electrical connection between the first bare chip 20 and an external circuit, e.g., a printed circuit board, etc. In view of this, because the quantity of the first solder balls 51 is substantially small, the spacing between adjacent two first solder balls 51 may satisfy the process demands, and the short-circuit issue between the solder balls may be effectively prevented when assembling the chip device and the external circuit. Thus, the reliability of the electrical connection between the chip device and the external circuit may be improved, the assembly difficulty of the chip device may be reduced to improve the production efficiency of the electronic products. The first solder ball 51 may be made of a material including any one of tin, lead, copper, silver, and alloys thereof, which may enable a desired electrical connection between chip device and an external circuit, e.g., a printed circuit board, etc. At the same time, the electrical connection between the chip device and the external circuit may be implemented through a welding process, and, thus, the assembly operation may be substantially simple and convenient.

To intuitively illustrate the technical solutions of the present disclosure, other film layer structures are not illustrated in FIG. 1 and FIG. 2. To better distinguish the first redistribution element 41 and the second redistribution element 42 in the first redistribution layer 40, the first redistribution element 41 and the second redistribution element 42 are filled with different patterns.

In the panel-level chip device in the disclosed embodiments, the first connection pillars having the same electrical signal on the first bare chip may be electrically connected to each other through the first redistribution element. The remaining first connection pillars may be led out through the second redistribution elements, respectively, to transmit electrical signals with the external circuit. In other words, the first redistribution layer may directly connect the first connection pillars that desire to be electrically connected to each other inside the chip device, and may lead out the first connection pillars that desire to be connected to an external circuit for providing electrical signals by the first solder balls.

On the one hand, the quantity of the solder balls in the chip device may be reduced, and the assembly difficulty between the chip device and the external circuit, e.g., the printed circuit board, etc., may be reduced. Thus, the reliability of the connection between the solder balls and the external circuit may be effectively ensured, malfunction phenomena of the electronic product caused by the short-circuit issue between solder balls may be reduced, and the production efficiency of electronic product may be improved. On the other hand, the layout complexity of external wires and the power consumption of the electronic product may be reduced, and the space occupied by the external wires in the electronic product may be effectively reduced, which may enable the electronic product to be developed toward miniaturization. In addition, the chip device may be packaged on a basis of the supporting base, and, thus, the conventional post injection molding process may be eliminated. Therefore, the packaging efficiency of the chip device may be effectively improved, and the production efficiency of the electronic product may be further improved.

In one embodiment, referring to FIG. 1 and FIG. 2, the supporting base 10 may be a flexible supporting base. The flexible supporting base may be made of a material including at least one of polyimide, polypropylene resin, and acrylic resin. Thus, the chip device may have desired flexibility, may withstand a certain degree of stress, and may effectively protect the first bare chip 20. At the same time, the supporting base 10 may have a single-layer or a multi-layer structure. When the supporting base 10 has a multi-layer structure, each layer of the flexible supporting base may be made of a same or a different material, which may be determined according to practical applications.

Figure 3:
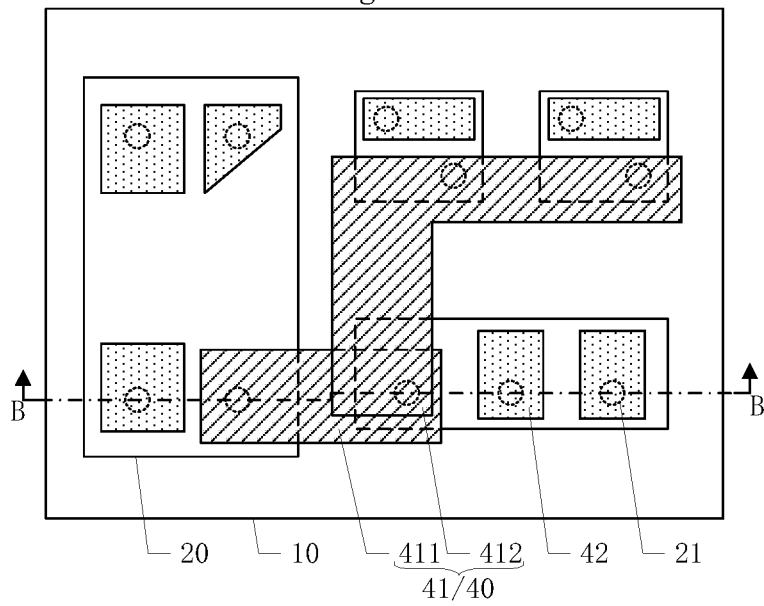
FIG. 3 illustrates a schematic top view of another exemplary panel-level chip device consistent with disclosed embodiments of the present disclosure.
Figure 4:
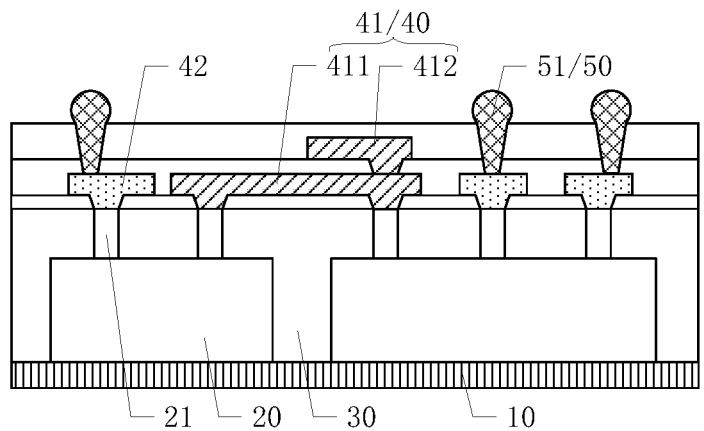
FIG. 4 illustrates a schematic B-B sectional view of an exemplary panel-level chip device in FIG. 3 consistent with disclosed embodiments of the present disclosure.

FIG. 3 illustrates a schematic top view of another panel-level chip device consistent with disclosed embodiments of the present disclosure; and FIG. 4 illustrates a schematic B-B sectional view of the panel-level chip device in FIG. 3. Referring to FIG. 3 and FIG. 4, the first redistribution element 41 may include at least one first wire portion 411 and at least one second wire portion 412, and the second wire portion 412 may be disposed on a side of the first wire portion 411 away from the first encapsulation layer 30. The second wire portion 412 may be electrically connected to the first wire portion 411, and the first wire portion 411 may be electrically connected to the first connection pillar 21.

In one embodiment, the first redistribution element 41 may include the first wire portion 411 and the second wire portion 412 that are disposed in different layers. The second wire portion 412 may be disposed on the side of the first wire portion 411 away from the first encapsulation layer 30. In other words, the first wire portion 411 may be disposed in a same layer as the second redistribution element 42, and both the first wire portion 411 and the second redistribution element 42 may be directly electrically connected to the first connection pillars 21. Because the first wire portion 411 is electrically connected to the second wire portion 412, in view of this, the first connection pillar 21 electrically connected to the first wire portion 411 may transmit an electrical signal to the second wire portion 412 through the first wire portion 411. Therefore, in the case where the wire layout of the first redistribution layer 40 is substantially complicated, the first redistribution element 41 may be disposed with a multi-layer wire layout to ensure that the first connection pillars 21 having the same electrical signal may be interconnected through the first redistribution element 41, such that the wire layout of the first redistribution layer 40 may be substantially flexible and convenient.

A quantity of the first wire portions 411 and a quantity of the second wire portions 412 in the first redistribution element 41 may be determined according to practical applications. For illustrative purposes, FIG. 3 merely illustrates one first wire portion 411 and one second wire portion 412 as an example. At the same time, the first wire portion 411 may be made of a same material as or a material different from the second wire portion 412, which may be determined according to practical applications.

Figure 5:
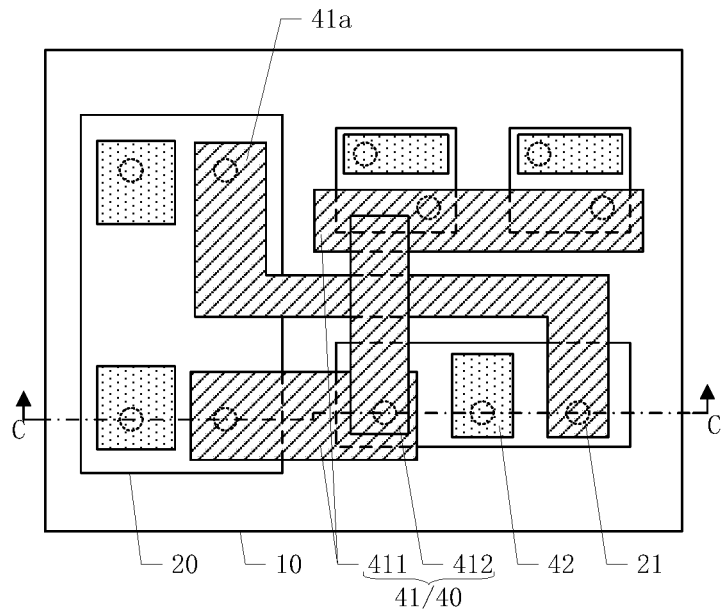
FIG. 5 illustrates a schematic top view of another exemplary panel-level chip device consistent with disclosed embodiments of the present disclosure.
Figure 6:
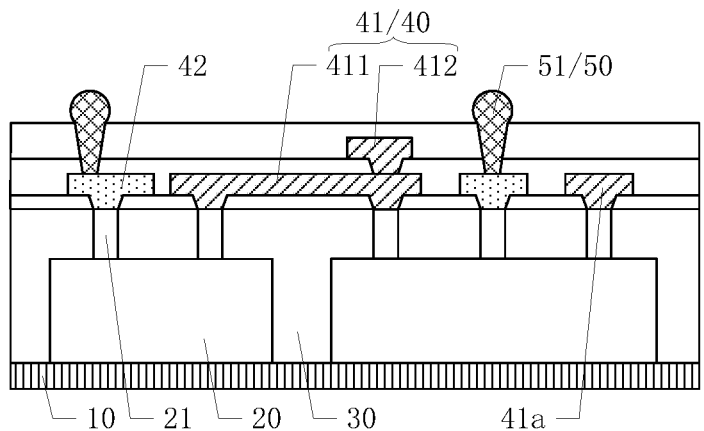
FIG. 6 illustrates a schematic C-C sectional view of an exemplary panel-level chip device in FIG. 5 consistent with disclosed embodiments of the present disclosure.

FIG. 5 illustrates a schematic top view of another panel-level chip device consistent with disclosed embodiments of the present disclosure; and FIG. 6 illustrates a schematic C-C sectional view of the panel-level chip device in FIG. 5. In one embodiment, referring to FIG. 5 and FIG. 6, the first redistribution element 41 may include at least two first wire portions 411, and the second wire portion 412 may be bridged between the at least two first wire portions 411.

In one embodiment, the first redistribution layer 40 may include one first redistribution element 41 including at least two first wire portions 411. In another embodiment, every first redistribution element 41 may include at least two first wire portions 411. For illustrative purposes, the first redistribution layer 40 including one first redistribution element 41 including at least two first wire portions 411 is described as an example, which is not limited by the present disclosure.

In one embodiment, one of the first redistribution elements 41 of the first redistribution layer 40 may include at least two first wire portions 411 that are disposed in a same layer. In view of this, when another first redistribution element 41a, which is disposed in a same layer as the one of the first redistribution elements 41, is arranged between adjacent two first wire portions 411, the adjacent two first wire portions 411 may be bridged by the second wire portion 412 that is disposed in a layer different from the first wire portion. In other words, the first wire portions 411 electrically connected to the first connection pillars 21 having the same electrical signal may be connected to each other through a cross-layer connection mode to implement transmission of the electrical signal. In view of this, because the second wire portion 412 and the another first redistribution element 41a are disposed in different layers, the occurrence of signal interference generated between the wires caused by too dense wire layout in the film layer where the first wire portion 411 is located may be effectively prevented. Therefore, the stability of the signal transmission in the chip device may be effectively ensured, and the wire layout of the first redistribution layer 40 may be substantially flexible and convenient, which may facilitate improving the integration degree of the chip device.

Figure 7:
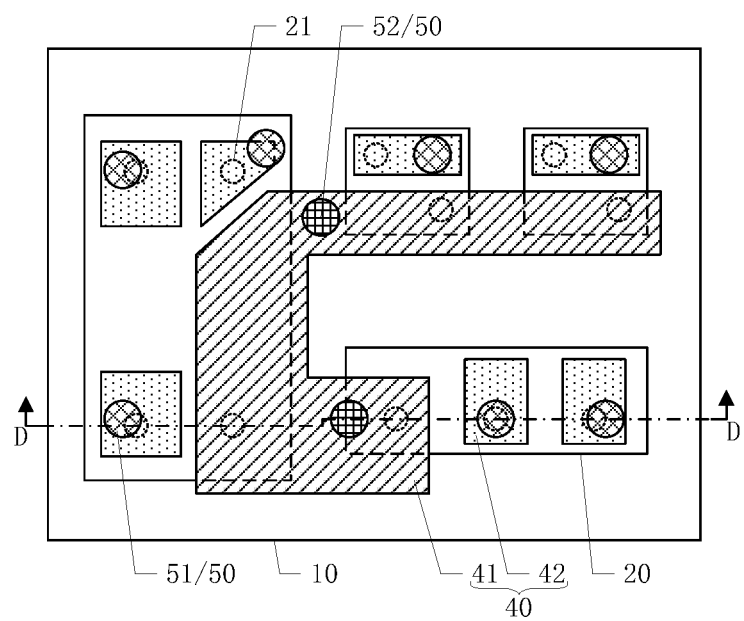
FIG. 7 illustrates a schematic top view of another exemplary panel-level chip device consistent with disclosed embodiments of the present disclosure.
Figure 8:
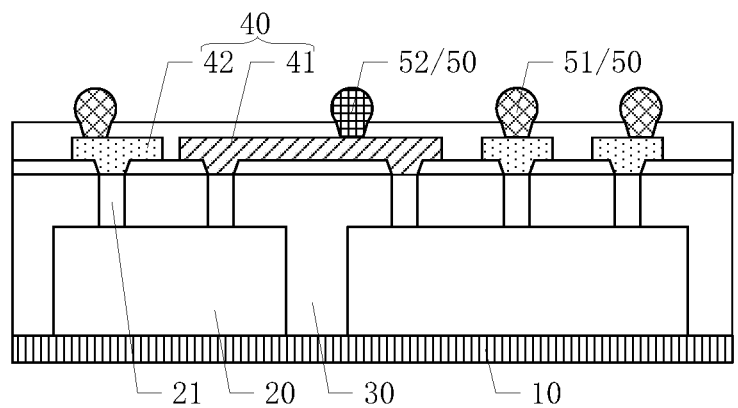
FIG. 8 illustrates a schematic D-D sectional view of an exemplary panel-level chip device in FIG. 7 consistent with disclosed embodiments of the present disclosure.

In one embodiment, FIG. 7 illustrates a schematic top view of another panel-level chip device consistent with disclosed embodiments of the present disclosure; and FIG. 8 illustrates a schematic D-D sectional view of the panel-level chip device in FIG. 7. Referring to FIG. 7 and FIG. 8, the solder ball group 50 may further include a plurality of second solder balls 52. At least one first redistribution element 41 may be electrically connected to at least one second solder ball 52.

In one embodiment, the first redistribution element 41 may be mainly used to electrically connect the first connection pillars 21 having the same electrical signal to each other. The at least one first redistribution element 41 may be electrically connected to the second solder ball 52 in the solder ball group 50. In other words, the at least one first redistribution element 41 may be led out through the second solder ball 52 to implement electrical connection with an external circuit, e.g., a printed circuit board, etc. Thus, the signal input/input mode of the chip device may be flexibly determined according to practical applications, which may enable the chip device to be used in a substantially wide range of applications.

The second solder ball 52 may be made of a material including any one of tin, lead, copper, silver and alloys thereof, and, thus, the chip device may have a substantially desired electrical connection with an external circuit, e.g., a printed circuit board, etc. At the same time, on a same one chip device, the second solder ball 52 may be made of a same material as the first solder ball 51, and, thus, the packaging process of the chip device may be simplified, and the production efficiency of the electronic product may be improved. In another embodiment, the second solder ball 52 may be made of a material different from the first solder ball 51 to distinguish the first and second solder balls, which may facilitate accurate alignment and improving assembly efficiency when assembling the chip device onto the external circuit.

In one embodiment, referring to FIG. 7, a total quantity of the first solder balls 51 and the second solder balls 52 is m1, and a quantity of the first connection pillars 21 is m2, where m1<m2.

In one embodiment, when the first connection pillar 21 is led out by one of the first solder ball 51 and the second solder ball 52, due to the disposure of the first redistribution layer 40, at least two first connection pillars 21 having the same electrical signal may be electrically connected to each other through one first redistribution element 41. Thus, the quantity of leads of the first bare chip 20 may be effectively reduced. At the same time, the first redistribution element 41 may be electrically connected to at least one second solder ball 52. In other words, for the same one first redistribution element 41, the quantity of the second solder balls 52 electrically connected thereto may be less than the quantity of the first connection pillars 21 electrically connected thereto. Thus, through appropriately setting the quantity of the second solder balls 52, the total quantity m1 of the first solder balls 51 and the second solder balls 52 may be smaller than the quantity m2 of the first connection pillars 21. In view of this, the quantity of solder balls on the surface of the chip device may be less than the quantity of the first connection pillars 21. Therefore, the spacing between the solder balls may satisfy the process requirements, and the short-circuit issue between the solder balls may be effectively prevented when assembling the chip device onto the external circuit, which may facilitate improving the reliability of the electrical connection between the chip device and the external circuit.

The second solder ball 52 may be electrically connected to the first redistribution element 41. Because the first redistribution element 41 may be mainly used to electrically connect the first connection pillars 21 having the same electrical signal to each other, the quantity of the second solder balls 52 may be flexibly determined according to practical applications. In one embodiment, when the first redistribution element 41 has a small length, the first redistribution element 41 may be electrically connected to one second solder ball 52. In another embodiment, when the first redistribution element 41 has a large length, the first redistribution element 41 may be electrically connected to a plurality of second solder balls 52 to reduce the loss of electrical signal when being transmitted on the first redistribution element 41.

For illustrative purposes, the chip device illustrated in FIG. 7 is used as an example, the quantity of the first solder balls 51 is seven, and the quantity of the second solder balls 52 is two. Thus, the total quantity m1 of the first solder balls 51 and the second solder balls 52 is nine. While, the quantity m2 of the first connection pillars 21 is eleven, i.e., m1<m2. For the chip device used in the electronic product, the quantity of the first bare chips 20 may be several or even dozens, and the quantity of the first connection pillars 21 on each first bare chip 20 may be several, dozens or even hundreds. In view of this, the total quantity m1 of the first solder balls 51 and the second solder balls 52 may far exceed the nine illustrated in FIG. 7. As long as the value of m1 is less than the value of m2, the total quantity m1 and the quantity m2 are not limited by the present disclosure.

Figure 9:
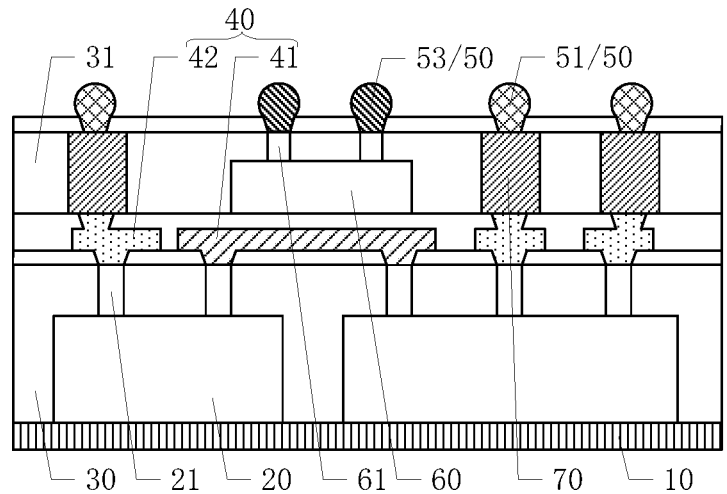
FIG. 9 illustrates another schematic A-A sectional view of an exemplary panel-level chip device in FIG. 1 consistent with disclosed embodiments of the present disclosure.

FIG. 9 illustrates another schematic A-A sectional view of the panel-level chip device in FIG. 1. In certain embodiments, referring to FIG. 1 and FIG. 9, the chip device may also include at least one second bare chip 60. The second bare chip 60 may be disposed on a side of the solder ball group 50 near the first redistribution layer 40, and a plurality of second connection pillars 61 may be disposed on a side of the second bare chip 60 away from the first redistribution layer 40. Moreover, the chip device may include a plurality of conduction portions 70 disposed on a side of the second redistribution element 42 away from the first encapsulation layer 30. The second redistribution element 42 may be electrically connected to the first solder ball 51 through the conduction portion 70. In addition, the chip device may include a second encapsulation layer 31. The second encapsulation layer 31 may cover the second bare chip 60, the second connection pillar 61 and the conduction portion 70, and may expose the side surfaces of both the second connection pillar 61 and the conduction portion 70 away from the first encapsulation layer 30. The solder ball group 50 may further include a plurality of third solder balls 53, and at least one second connection pillar 61 may be electrically connected to the third solder balls 53.

In one embodiment, the second bare chip 60 may be disposed on a side of the solder ball group 50 near the first redistribution layer 40. In other words, the second bare chip 60 and the first bare chip 20 may be arranged in a direction perpendicular to the plane of the supporting base 10. Therefore, not only the quantity of the bare chips in the chip device may increase, but also the size of the chip device in the direction parallel to the plane of the supporting base 10 may decrease, which may effectively improve the integration degree of the chip device. The quantity of the second bare chips 60 may be determined according to practical applications. For illustrative purposes, FIG. 9 illustrates one second bare chip 60 as an example, and details are not described herein. The size and function of the second bare chip 60 may be the same as or different from the first bare chip 20, which is not limited by the present disclosure.

The second encapsulation layer 31 may expose the side surfaces of both the second connection pillar 61 and the conduction portion 70 away from the first encapsulation layer 30. Thus, the second connection pillar 61 may have a desired electrical connection with the third solder ball 53, and the conduction portion 70 may have a desired electrical connection with the first solder ball 51. In view of this, the second connection pillar 61 may be led out through the third solder ball 53 to implement electrical connection between the second bare chip 60 and an external circuit, e.g., a printed circuit board. The second connection pillar 61 may be made of a material including but not limited to at least one of copper, silver, nickel, gold and alloys thereof. Similar to the first connection pillar 21, the second connection pillar 61 may have a single layer or a multi-layer structure. Details of the second connection pillar 61 may refer to the foregoing description of the first connection pillar 21, which is not repeated herein.

The second redistribution element 42 may be electrically connected to the first solder ball 51 through the conduction portion 70. The conduction portion 70 may be made of a material having desired electrical conductivity, e.g., copper, iron, or nickel, etc., to reduce the loss of electrical signal when being transmitted on the conduction portion 70. The conduction portion 70 and the bare chip may be pre-fabricated before performing the packaging process of the chip device. When subsequently performing the packaging process, the conduction portion 70 and the bare chip may desire to be placed at corresponding positions, which may facilitate improving the packaging efficiency of the chip device.

The electrical connection mode between the conduction portion 70 and the second redistribution element 42 may be flexibly set according to practical applications. In one embodiment, the side surface of the second redistribution element 42 away from the first bare chip 20 may be extended to a bottom of the second encapsulation layer 31. In view of this, the conduction portion 70 may be electrically connected to the second redistribution element 42 by soldering, attaching, etc. The conduction portion 70 may be electrically connected to the second redistribution element 42 by other means. For illustrative purposes, FIG. 9 illustrates the former case as an example.

Same as the first encapsulation layer 30, the second encapsulation layer 31 may be made of a material having desired sealing property and easy molding packaging property, e.g., epoxy molding compound (EMC), etc. Thus, a molding packaging process may be directly used to cover the second bare chip 60, the second connection pillar 61 and the conduction portion 70, which may facilitate reducing the packaging difficulty of the chip device and improving the packaging efficiency. On the other hand, the second encapsulation layer 31 and the insulating layer between the second encapsulation layer 31 and the first redistribution layer 40 may jointly protect the second bare chip 60, the second connection pillar 61 and the conduction portion 70, which may prevent external factors, e.g., water and oxygen, etc., from affecting the electrical performance of the chip device.

Figure 10:
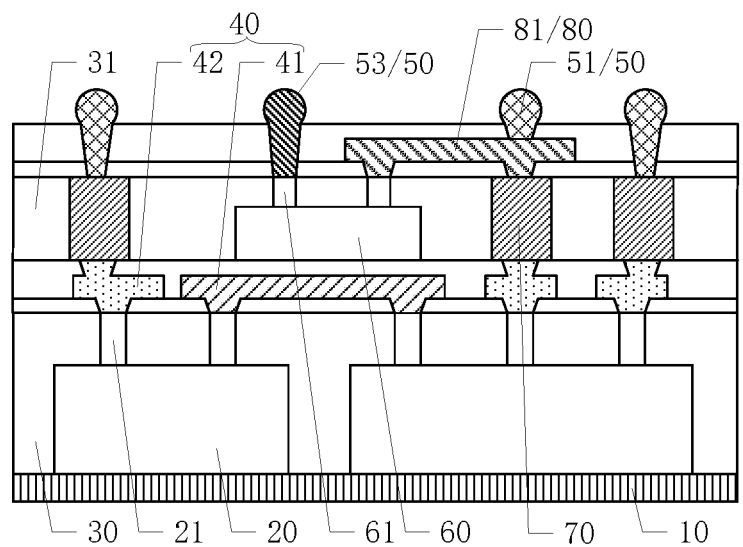
FIG. 10 illustrates another schematic A-A sectional view of an exemplary panel-level chip device in FIG. 1 consistent with disclosed embodiments of the present disclosure.

FIG. 10 illustrates another schematic A-A sectional view of the panel-level chip device in FIG. 1. In one embodiment, referring to FIG. 1 and FIG. 10, the chip device may further include a second redistribution layer 80. The second redistribution layer 80 may be disposed between the second encapsulation layer 31 and the solder ball group 50. The second redistribution layer 80 may include at least one third redistribution element 81. At least one second connection pillar 61 may be electrically connected to the conduction portion 70 through the third redistribution element 81.

In one embodiment, the second redistribution layer 80 may be disposed between the second encapsulation layer 31 and the solder ball group 50. Thus, the leads of the second connection pillar 61 and the conduction portion 70 may be fanned out through the second redistribution layer 80, such that the wire layout in the chip device may be substantially flexible and convenient. In one embodiment, in the second redistribution layer 80, at least one second connection pillar 61 may be electrically connected to the conduction portion 70 through the third redistribution element 81. Thus, the second connection pillar 61 and the conduction portion 70 may be directly led out through the first solder ball 51 or the third solder ball 53, which may facilitate reducing the quantity of solder balls of the chip device and reducing the assembly difficulty between the chip device and an external circuit, e.g., a printed circuit board, etc. At the same time, electrical signal may be transmitted between the second bare chip 60 and the first bare chip 20 through the third redistribution element 81, to adapt to the diverse wire layout demands of the chip device, such that the chip device may be used in a substantially wide range of applications.

Similar to the first redistribution element 41, the third redistribution element 81 may have a single-layer or multi-layer structure, which is not limited by the present disclosure. For illustrative purposes, FIG. 10 illustrates the third redistribution element 81 and the first redistribution element 41 each having a single layer structure as an example. In a case where the wire layout of the chip device is complicated, use of the multi-layer structure for the third redistribution element 81 and the first redistribution element 41 may facilitate reducing the difficulty of the wire layout and ensuring a substantially high integration degree of the chip device.

In one embodiment, referring to FIG. 10, a total quantity of the first solder balls 51 and the third solder balls 53 is n1; and the total quantity of the first connection pillars 21 and the second connection pillars 61 is n2, wherein n1<n2.

In one embodiment, when the second connection pillar 61 is led out through one of the first solder ball 51 and the third solder ball 53, due to the disposure of the first redistribution layer 40 and the second redistribution layer 80, at least one second connection pillar 61 may be electrically connected to the conduction portion 70 through one third redistribution element 81. Because the conduction portion 70 is electrically connected to the first connection pillar 21 through the second redistribution element 42, and the first connection pillars 21 having the same electrical signal are electrically connected to each other through the first redistribution element 41, the quantity of leads of the bare chip in the chip device may be effectively reduced.

At the same time, the third redistribution element 81 may be led out through one of the first solder ball 51 and the third solder ball 53. In other words, for a same one third redistribution element 81, the quantity of the first solder balls 51 and the third solder balls 53 electrically connected thereto may be less than the quantity of the first connection pillars 21 and the second connection pillars 61 electrically connected thereto. Thus, through appropriately setting the quantity of the first solder balls 51 and the third solder balls 53, the total quantity n1 of the first solder balls 51 and the third solder balls 53 may be smaller than the quantity n2 of the first connection pillars 21 and the second connection pillars 61. In view of this, the quantity of the solder balls on the surface of the chip device may be less than the quantity of connection pillars. Therefore, there may be sufficient spacing between the solder balls to satisfy the process requirements, and the short-circuit issue between the solder balls may be effectively prevented when assembling the chip device onto the external circuit, which may facilitate improving the reliability of the electrical connection between the chip device and the external circuit.

The quantities of the first connection pillars 21, the second connection pillars 61, the first solder balls 51, and the third solder balls 53 may be determined according to the actually desired wire layout requirements of the chip device, as long as the quantities satisfy the above relationship, which are not limited by the present disclosure.

Figure 11:
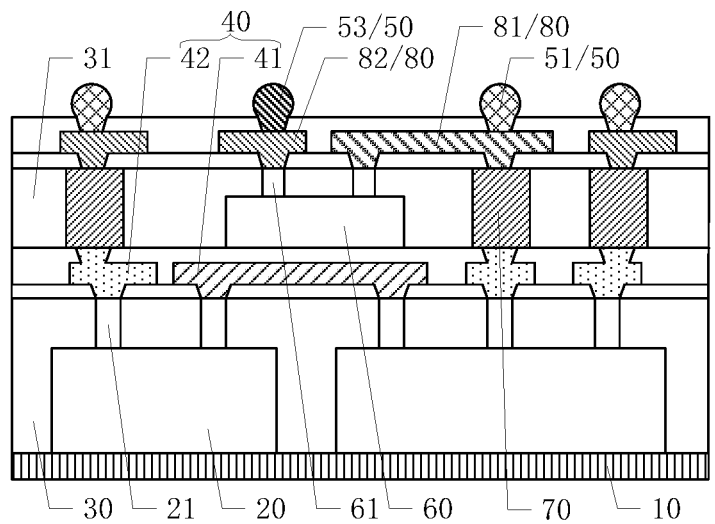
FIG. 11 illustrates another schematic A-A sectional view of an exemplary panel-level chip device in FIG. 1 consistent with disclosed embodiments of the present disclosure.

FIG. 11 illustrates another schematic A-A sectional view of the panel-level chip device in FIG. 1. In one embodiment, referring to FIG. 1 and FIG. 11, the second redistribution layer 80 may further include a plurality of fourth redistribution elements 82. At least one conduction portion 70 may be electrically connected to the first solder ball 51 through the fourth redistribution element 82, and the at least one second connection pillar 61 may be electrically connected to the third solder ball 53 through the fourth redistribution element 82.

In one embodiment, the disposure of the plurality of fourth redistribution elements 82 between the second encapsulation layer 31 and the solder ball group 50 may enable the leads of one or more of the at least one second connection pillar 61 and the at least one conduction portion 70 to be fanned out through the fourth redistribution element 82. The quantity of the fourth redistribution elements 82 may be determined according to practical applications, such that the wire layout of the chip device may be substantially flexible and convenient.

Figure 12:
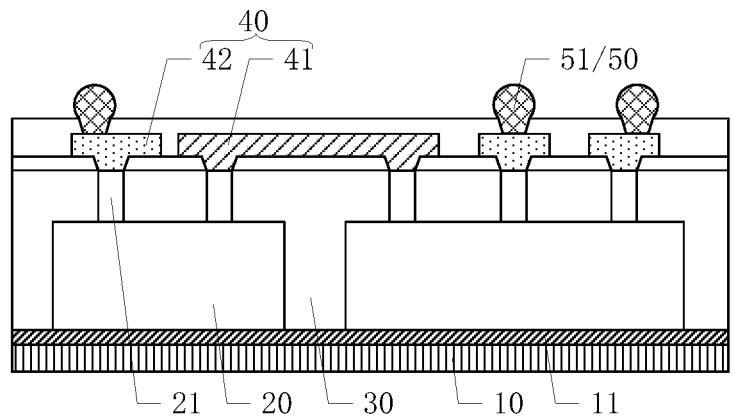
FIG. 12 illustrates another schematic A-A sectional view of an exemplary panel-level chip device in FIG. 1 consistent with disclosed embodiments of the present disclosure.

FIG. 12 illustrates another schematic A-A sectional view of the panel-level chip device in FIG. 1. In one embodiment, referring to FIG. 1 and FIG. 12, the chip device may further include a protection layer 11. The protection layer 11 may be disposed between the supporting base 10 and the plurality of first bare chips 20.

In one embodiment, the protection layer 11 may be disposed between the supporting base 10 and the first bare chip 20. On the one hand, the protection layer 11 may effectively block the high temperature used for forming the first encapsulation layer 30 by the molding packaging process, and may effectively protect the supporting base 10. On the other hand, the protection layer 11 may effectively prevent the external water and oxygen from penetrating into the chip device through the supporting base 10, and, thus, the chip device may have desired electrical performance. In view of this, the protection layer 11 may be made of a material having high temperature resistance and desired sealing property, e.g., silicide, etc. The protection layer may be directly formed on the surface of the supporting base 10 by a coating process, etc., which may facilitate reducing difficulty of the packaging process of the chip device and improving the production efficiency of the electronic product.

Figure 13:
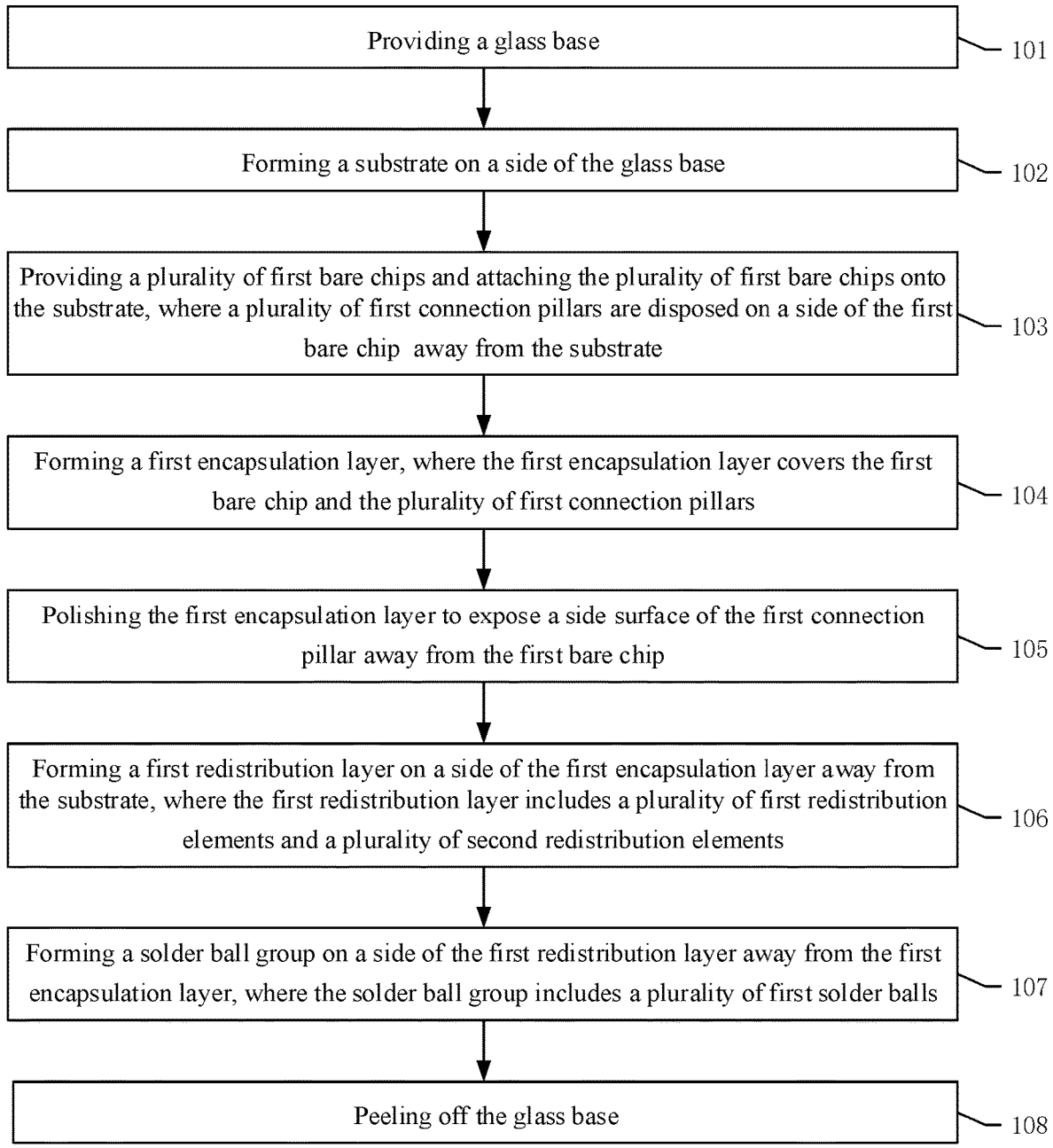
FIG. 13 illustrates a flow chart of an exemplary packaging method for forming a panel-level chip device consistent with disclosed embodiments of the present disclosure.
Figure 14:
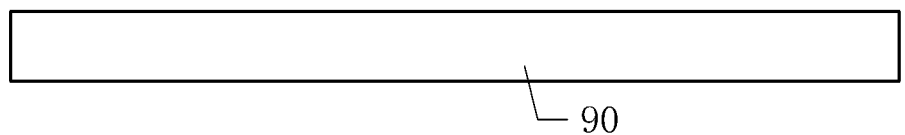
FIGS. 14-20 illustrate schematic sectional views of semiconductor structures corresponding to certain stages of an exemplary packaging method for forming a panel-level chip device in FIG. 13 consistent with disclosed embodiments of the present disclosure.
Figure 15:
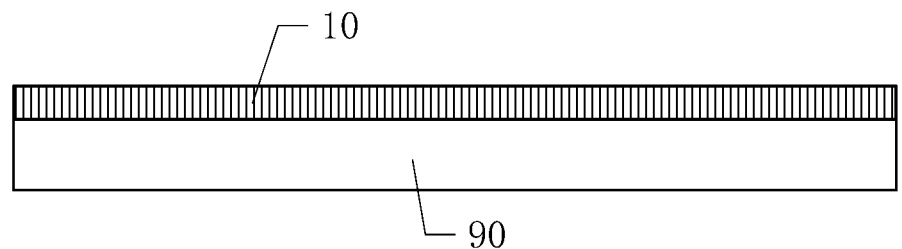
Figure 16:
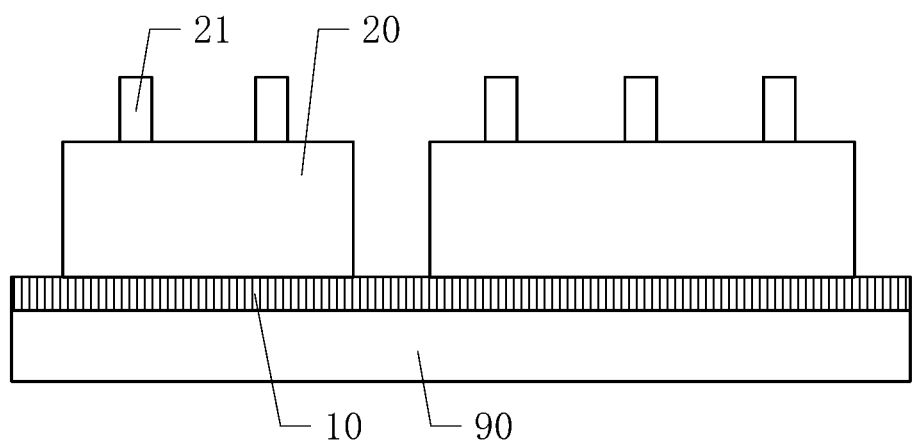
Figure 17:
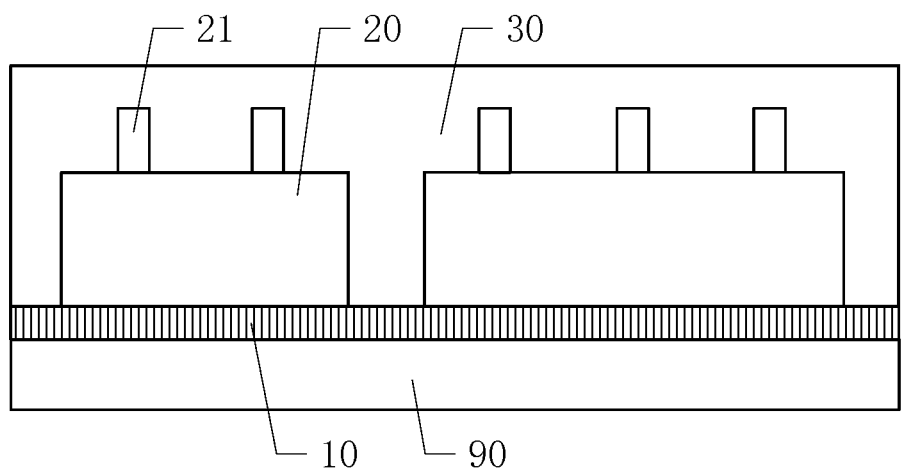
Figure 18:
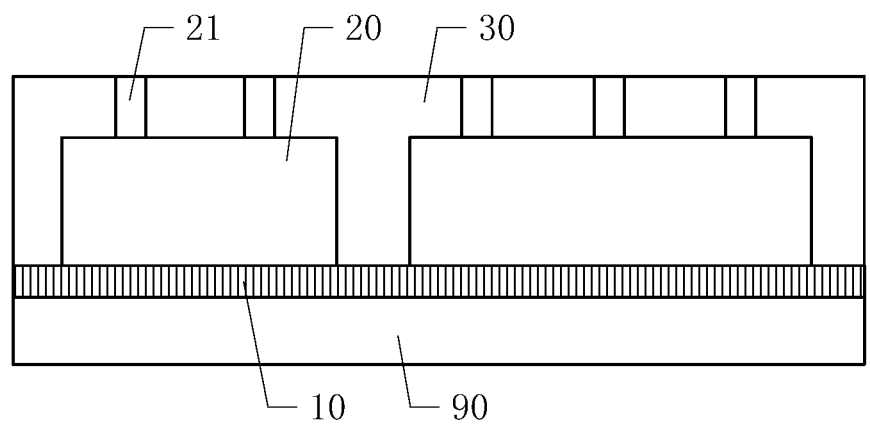
Figure 19:
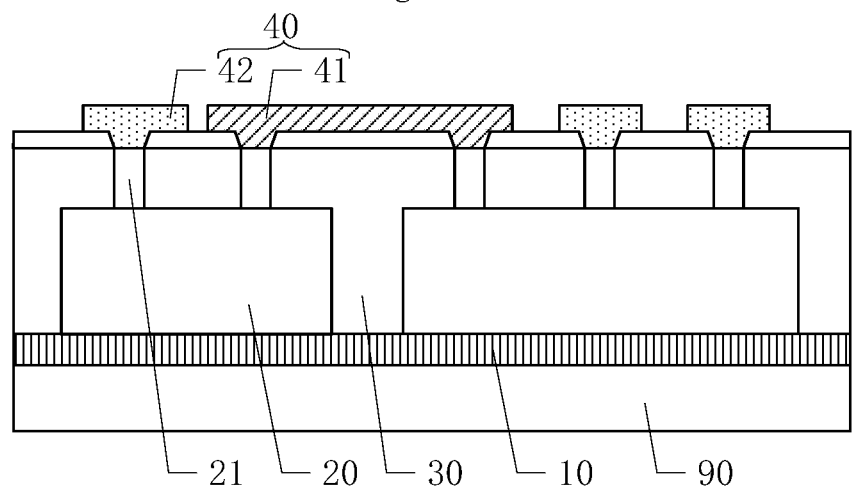
Figure 20:
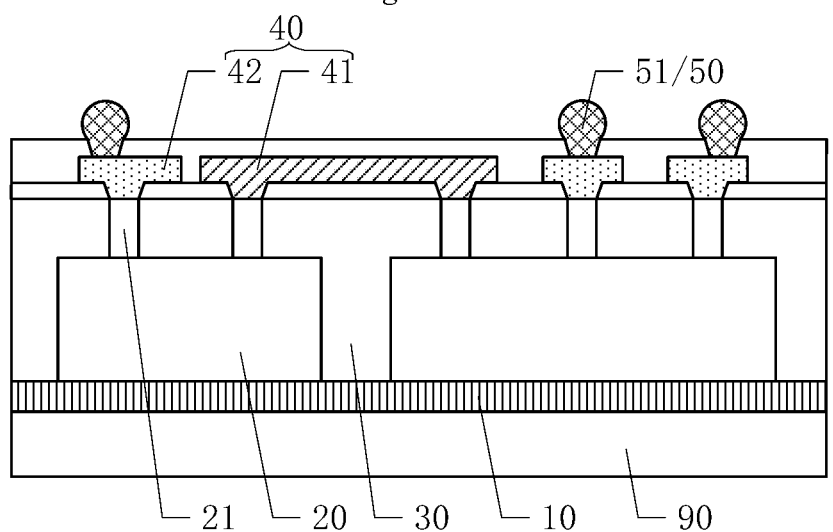

The present disclosure also provides a packaging method for forming a panel-level chip device. FIG. 13 illustrates a flow chart of a packaging method for forming the panel-level chip device consistent with disclosed embodiments of the present disclosure; and FIGS. 14-20 illustrate schematic sectional views of semiconductor structures corresponding to certain stages of the packaging method. Referring to FIG. 1, FIG. 2 and FIGS. 13-20, the packaging method may include the following.

S101: Providing a glass substrate 90.

S102: Forming a supporting base 10 on a surface of the glass substrate 90.

S103: Providing a plurality of first bare chips 20 and attaching the plurality of first bare chips 20 onto the supporting base 10. A plurality of first connection pillars 21 may be disposed on a side of the first bare chip 20 away from the supporting base 10.

S104: Forming a first encapsulation layer 30. The first encapsulation layer 30 may cover the first bare chips 20 and the first connection pillars 21.

S105: Polishing the first encapsulation layer 30 to expose a side surface of the first connection pillar 21 away from the first bare chip 20.

S106: Forming a first redistribution layer 40 on a side of the first encapsulation layer 30 away from the supporting base 10. The first redistribution layer 40 may include a plurality of first redistribution elements 41 and a plurality of second redistribution elements 42. The first connection pillars 21 having a same electrical signal may be electrically connected to each other through the first redistribution element 41, and the remaining first connection pillars 21 may be electrically connected to the second redistribution elements 42, respectively.

S107: Forming a solder ball group 50 on a side of the first redistribution layer 40 away from the first encapsulation layer 30. The solder ball group 50 may include a plurality of first solder balls 51, and the second redistribution element 42 may be electrically connected to the first solder ball 51.

S108: Peeling off the glass substrate 90.

In one embodiment, the glass substrate 90 may be mainly used to temporarily support the subsequently formed chip device. When peeling off the glass substrate 90 in S108, a chemical lift-off process or a laser lift-off process may be performed. To facilitate the peeling-off operation, a peeling-off film may be attached to the surface of the glass substrate 90 in advance, and, thus, the glass substrate 90 may be effectively protected by the peeling-off film. Therefore, the glass substrate 90 may be reused when performing the packaging process on another batch of chip devices, which may facilitate reducing the cost of the packaging process. The peeling-off film may be a film layer that can be easily peeled off by a chemical lift-off process or a laser lift-off process, e.g., an ultraviolet peeling-off film, a thermal peeling-off film, etc. In another embodiment, S108 may be performed before S107 according to practical applications. In other words, the glass substrate 90 may be first peeled off from the supporting base 10, and then the solder ball group 50 may be formed, which is not limited by the present disclosure.

When attaching the first bare chip 20 onto the supporting base 10, the quantity of the first bare chips 20 and the specific layout thereof on the supporting base 10 may be determined according to practical applications. The first connection pillar 21 may be pre-mounted on the first bare chip 20 before performing the packaging process of the chip device, which may facilitate improving the efficiency of the packaging process.

When forming the first encapsulation layer 30, the first encapsulation layer 30 may fully cover the first bare chips 20 and the first connection pillars 21. Before performing the subsequent packaging process, an encapsulation structure formed by the first encapsulation layer 30, the supporting base 10, and the glass substrate 90 may effectively prevent the external water and oxygen from affecting the electrical performance of the first bare chip 20, and may facilitate storage. When performing the subsequent packaging process, the first encapsulation layer 30 may desire to be polished to expose the side surface of the first connection pillar 21 away from the first bare chip 20. Thus, the first connection pillar 21 may have desired electrical connection with the subsequently formed first redistribution layer 40. The polishing process may be replaced by any other suitable process, e.g., an etching process, etc., according to practical applications.

When forming the first redistribution layer 40, the first redistribution element 41 in the first redistribution layer 40 may be mainly used for electrically connecting the first connection pillars 21 having the same electrical signal to each other. In other words, the leads of the first connection pillars 21 may be directly packaged in the chip device and may not desire to be led out through the first solder ball 51. In view of this, the quantity of the first solder balls 51 may be reduced, and the assembly difficulty between the chip device and an external circuit, e.g., a printed circuit board (PCB), etc., may be reduced.

The second redistribution element 42 in the first redistribution layer 40 may be mainly used to electrically connect the remaining first connection pillars 21 and the first solder balls 51, respectively. In other words, the first connection pillar 21 may be led out through the first solder ball 51 to implement the electrical connection between the first bare chip 20 and an external circuit, e.g., a printed circuit board, etc. In view of this, because the quantity of the first solder balls 51 is substantially small, the spacing between adjacent two first solder balls 51 may satisfy the process demands, and the short-circuit issue between the solder balls may be effectively prevented when assembling the chip device onto the external circuit. Thus, the reliability of the electrical connection between the chip device and the external circuit may be improved, and the assembly difficulty of the chip device may be reduced to improve the production efficiency of the electronic product.

The process for forming the first redistribution layer 40 may include an electroplating process, a chemical plating process, and an etching process, etc., which are not limited by the present disclosure.

Figure 21:
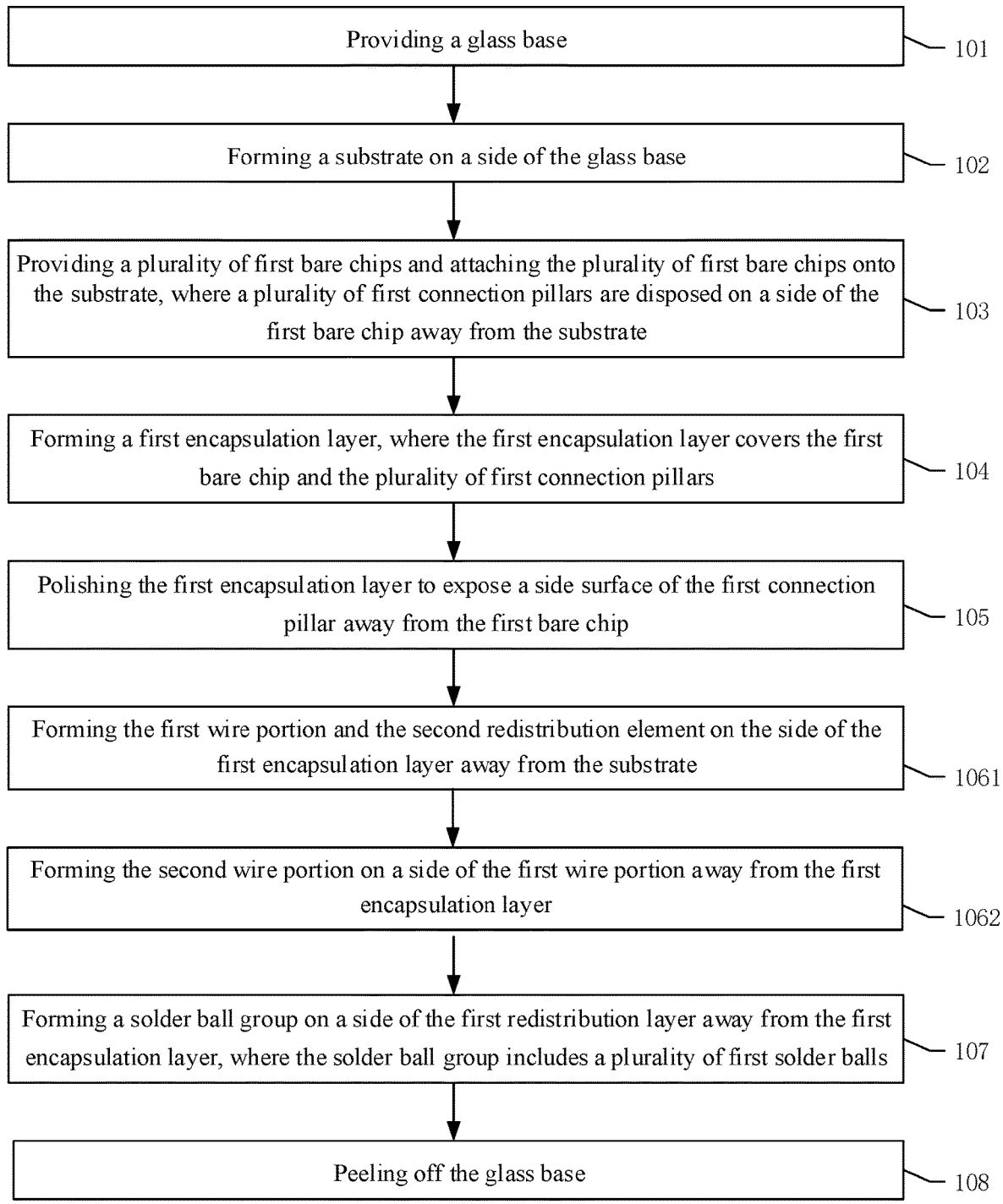
FIG. 21 illustrates a flow chart of another exemplary packaging method for forming a panel-level chip device consistent with disclosed embodiments of the present disclosure.
Figure 22:
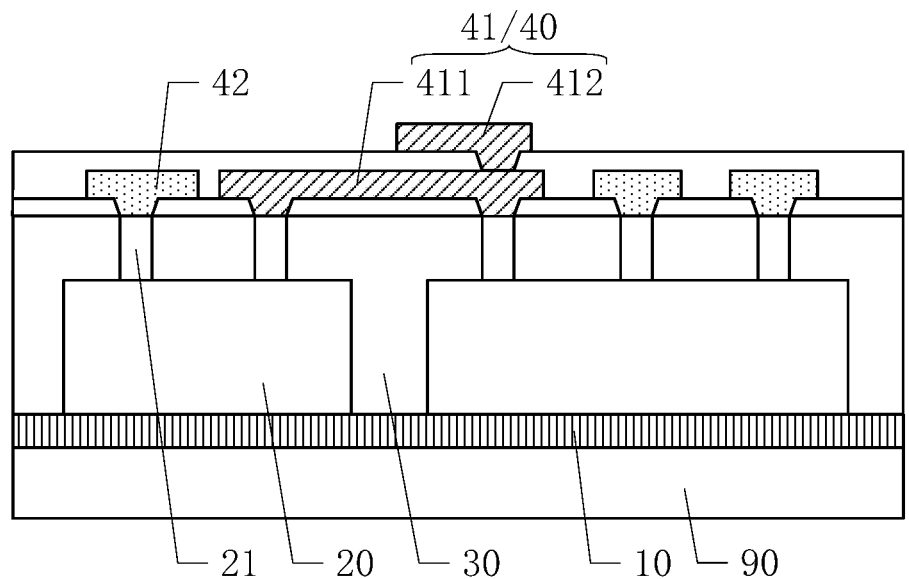
FIGS. 22-23 illustrate schematic sectional views of semiconductor structures corresponding to certain stages of an exemplary packaging method for forming a panel-level chip device in FIG. 21 consistent with disclosed embodiments of the present disclosure.
Figure 23:
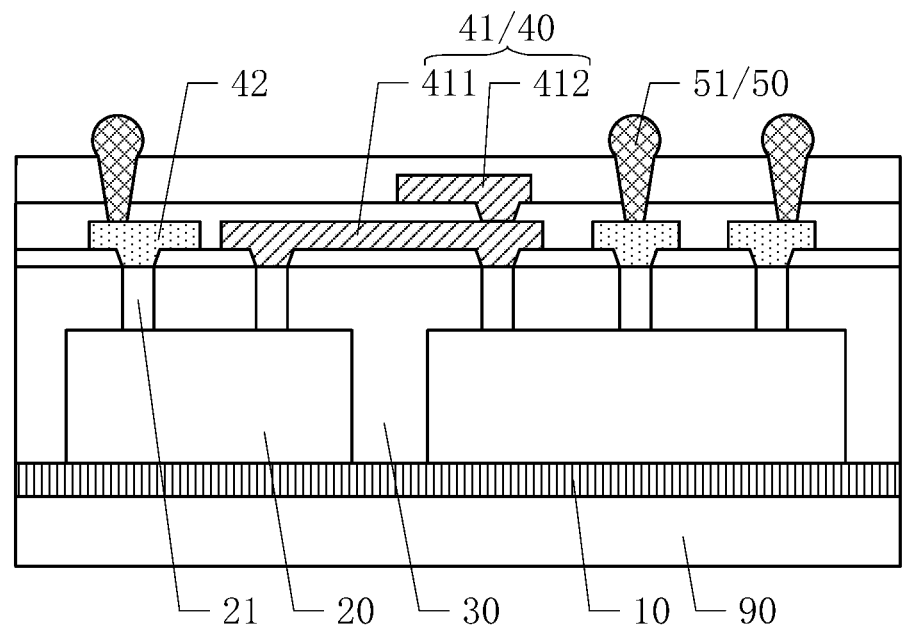

FIG. 21 illustrates a flow chart of another packaging method for forming the panel-level chip device consistent with disclosed embodiments of the present disclosure; and FIGS. 22-23 illustrate schematic sectional views of semiconductor structures corresponding to certain stages of the packaging method in FIG. 21. In one embodiment, referring to FIG. 3, FIG. 4, FIG. 13 and FIGS. 21-23, the first redistribution element 41 may include at least one first wire portion 411 and at least one second wire portion 412, and forming the first redistribution layer 40 on the side of the first encapsulation layer 30 away from the supporting base 10 may further include the following.

S1061: Forming the first wire portion 411 and the second redistribution element 42 on the side of the first encapsulation layer 30 away from the supporting base 10.

S1062: Forming the second wire portion 412 on the side of the first wire portion 411 away from the first encapsulation layer 30. The second wire portion 412 may be electrically connected to the first wire portion 411, and the first wire portion 411 may be electrically connected to the first connection pillar 21.

In one embodiment, the first redistribution element 41 may include the first wire portion 411 and the second wire portion 412 that are disposed in different layers. In other words, the first redistribution element 41 of the first redistribution layer 40 may be disposed with a multi-layer wire layout to ensure that the first connection pillars 21 having the same electrical signal may be interconnected through the first redistribution element 41, such that the wire layout of the first redistribution layer 40 may be substantially flexible and convenient. The first wire portion 411 may be disposed in a same layer as the second redistribution element 42, and the first wire portion 411 may be disposed on a side of the second wire portion 412 near the first encapsulation layer 30. In view of this, both the first wire portion 411 and the second redistribution element 42 may be directly electrically connected to the first connection pillar 21, and the electrical signal may be transmitted through the first connection pillar 21.

The first wire portion 411 may be formed by a same process as or a process different from the second wire portion 412, which may be determined according to practical applications. To ensure packaging efficiency, the first wire portion 411 may be made of a same material as or a material different from the second wire portion 412, which may be determined according to practical applications. The remaining processes may refer to corresponding descriptions associated with FIGS. 14-19, which are not repeated herein.

Figure 24:
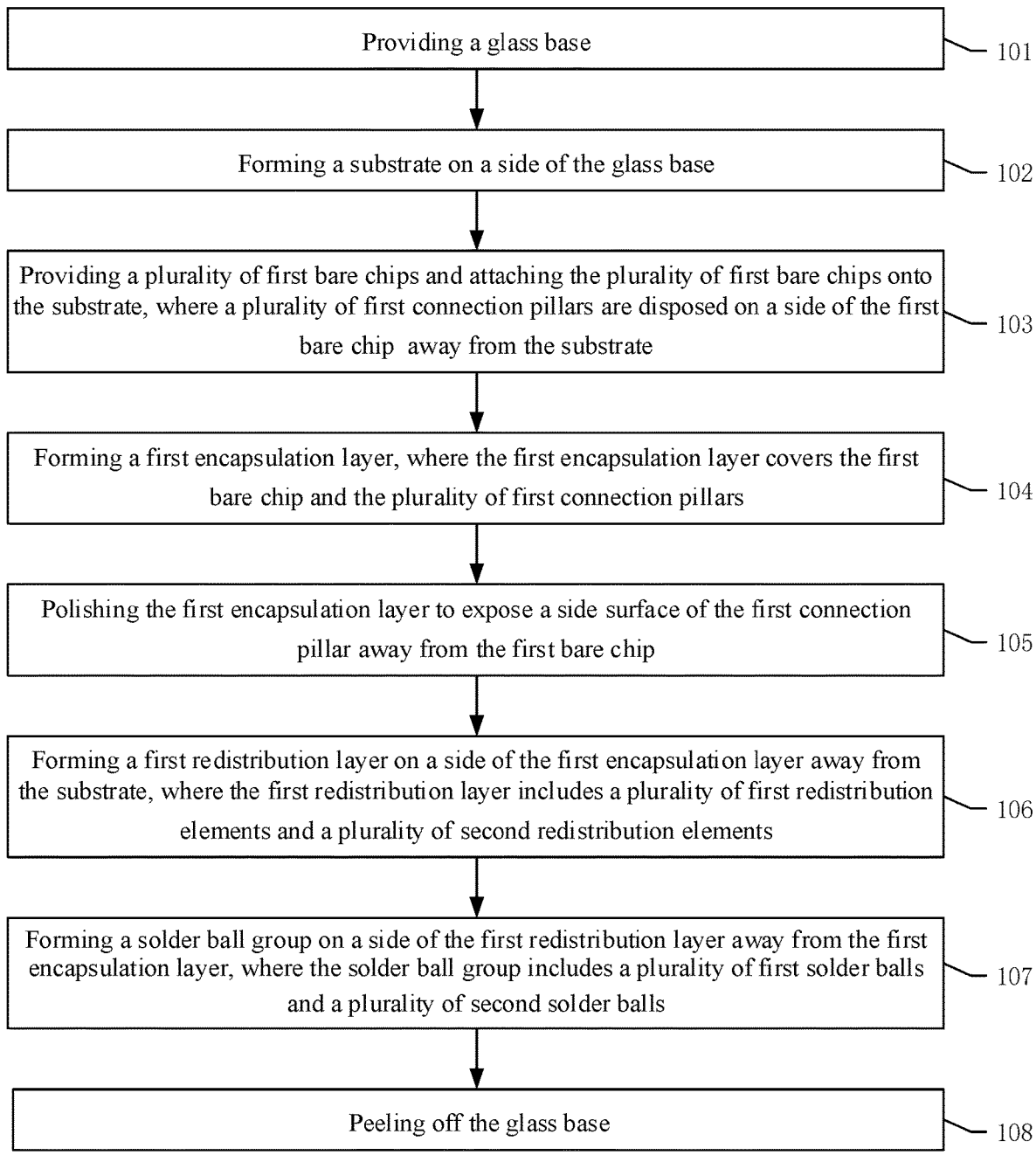
FIG. 24 illustrates a flow chart of another exemplary packaging method for forming a panel-level chip device consistent with disclosed embodiments of the present disclosure.
Figure 25:
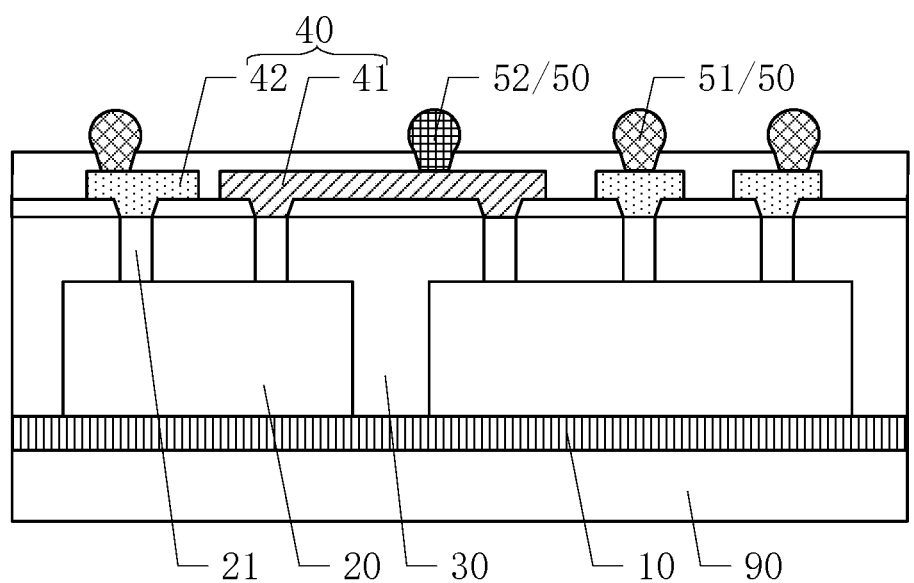
FIG. 25 illustrates a schematic sectional view of a semiconductor structure corresponding to certain stage of an exemplary packaging method for forming a panel-level chip device in FIG. 24 consistent with disclosed embodiments of the present disclosure.

FIG. 24 illustrates a flow chart of another packaging method for forming the panel-level chip device consistent with disclosed embodiments of the present disclosure; and FIG. 25 illustrates a schematic sectional view of a semiconductor structure corresponding to certain stage of the packaging method for forming the panel-level chip device in FIG. 24. In one embodiment, referring to FIGS. 7-8 and FIGS. 24-25, when forming the solder ball group 50 on the side of the first redistribution layer 40 away from the first encapsulation layer 30 in S107, the solder ball group 50 may further include a plurality of second solder balls 52. At least one first redistribution element 41 may be electrically connected to at least one second solder ball 52.

In one embodiment, by forming the second solder ball 52, the at least one first redistribution element 41 may be led out through the second solder ball 52 to implement electrical connection between the first redistribution element 41 and an external circuit, e.g., a printed circuit board, etc. Thus, the signal input/input mode of the chip device may be flexibly determined according to practical applications. The second solder ball 52 may be made of a same material as the first solder ball 51. The second solder ball 52 and the first solder ball 51 may be formed together, or may be formed one after another, which is not limited by the present disclosure. The remaining processes may refer to corresponding descriptions associated with FIGS. 14-19, which are not repeated herein.

Figure 26:
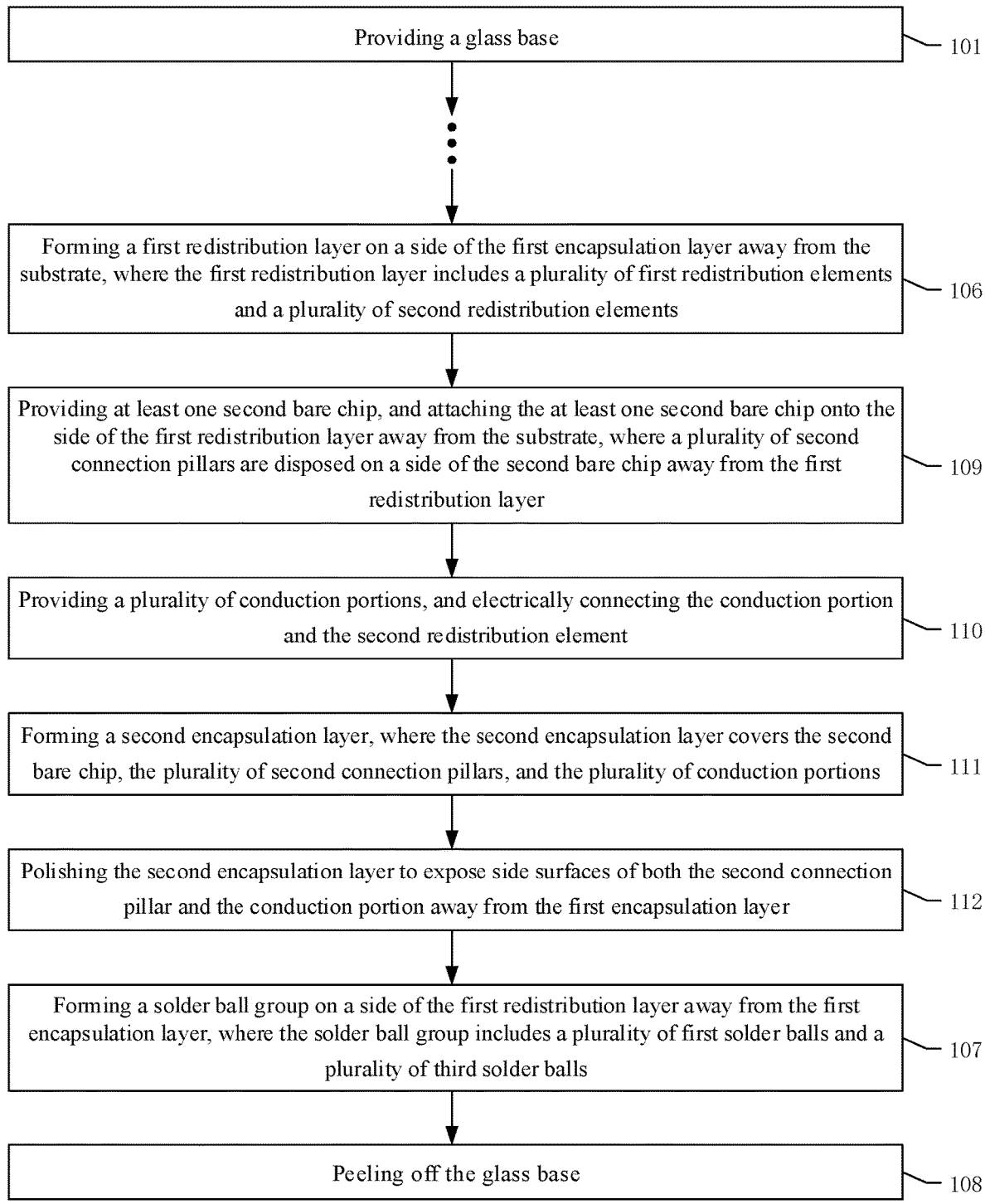
FIG. 26 illustrates a flow chart of another exemplary packaging method for forming a panel-level chip device consistent with disclosed embodiments of the present disclosure.
Figure 27:
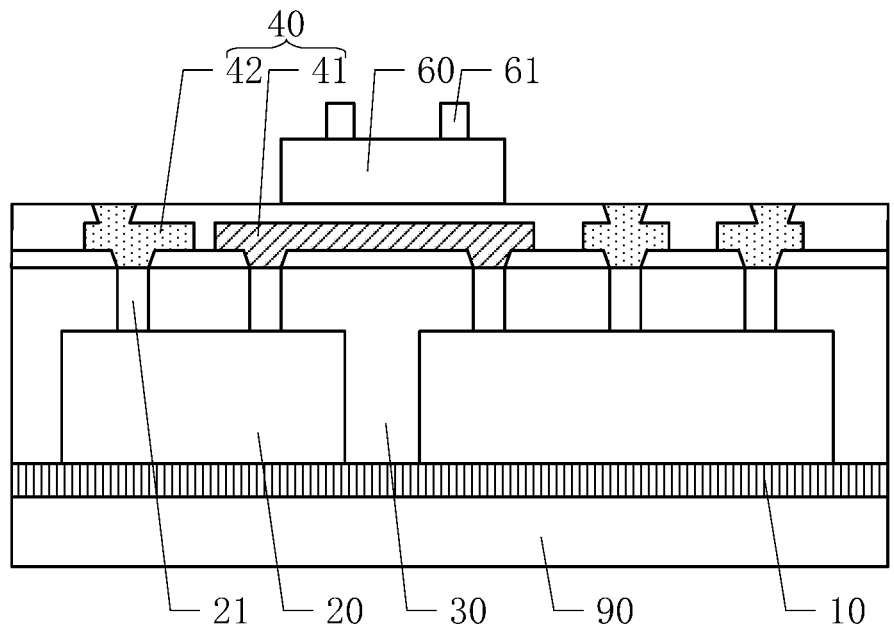
FIGS. 27-31 illustrate schematic sectional views of semiconductor structures corresponding to certain stages of an exemplary packaging method for forming a panel-level chip device in FIG. 26 consistent with disclosed embodiments of the present disclosure.
Figure 28:
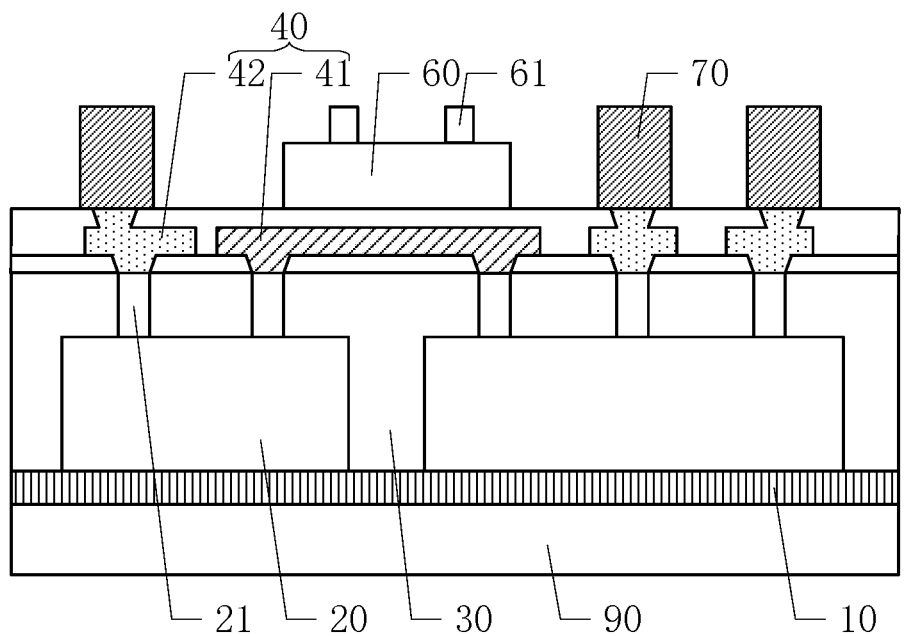
Figure 29:
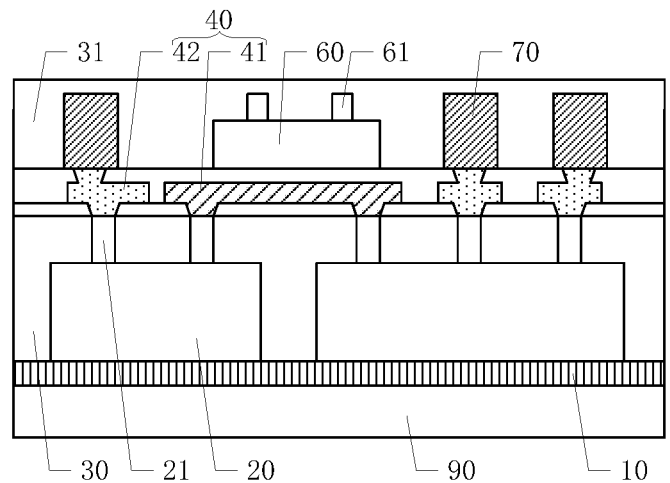
Figure 30:
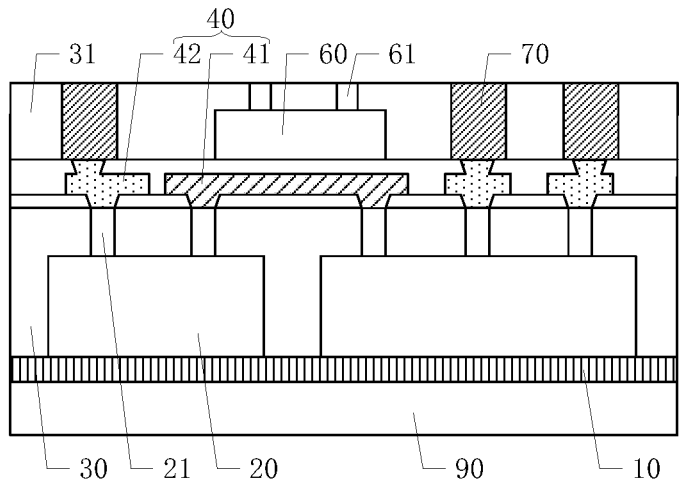
Figure 31:
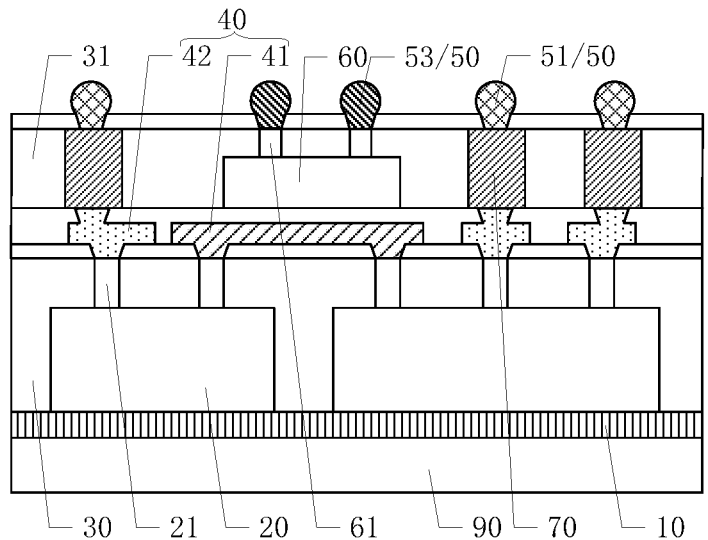

FIG. 26 illustrates a flow chart of another packaging method for forming the panel-level chip device consistent with disclosed embodiments of the present disclosure; and FIGS. 27-31 illustrate schematic sectional views of semiconductor structures corresponding to certain stages of the packaging method for forming the panel-level chip device in FIG. 26. Referring to FIG. 1, FIG. 9 and FIGS. 26-31, before forming the solder ball group 50 on the side of the first redistribution layer 40 away from the first encapsulation layer 30 in S107, the packaging method may further include the following.

S109: Providing and attaching at least one second bare chip 60 onto the side of the first redistribution layer 40 away from the supporting base 10. A plurality of second connection pillars 61 may be disposed on a side of the second bare chip 60 away from the first redistribution layer 40.

S110: Providing a plurality of conduction portions 70, and electrically connecting the conduction portion 70 to the second redistribution element 42. The conduction portion 70 may be disposed on a side of the second redistribution element 42 away from the first encapsulation layer 30.

S111: Forming a second encapsulation layer 31. The second encapsulation layer 31 may cover the second bare chip 60, the second connection pillar 61 and the conduction portion 70.

S112: Polishing the second encapsulation layer 31 to expose side surfaces of both the second connection pillar 61 and the conduction portion 70 away from the first encapsulation layer 30.

When forming the solder ball group 50 on the side of the first redistribution layer 40 away from the first encapsulation layer 30 in S107, the solder ball group 50 may further include a plurality of third solder balls 53. At least one second connection pillar 61 may be electrically connected to the third solder ball 53.

In one embodiment, the first bare chip 20 and the second bare chip 60 may be sequentially disposed in the chip device. The second bare chip 60 and the first bare chip 20 may be arranged in a direction perpendicular to the plane of the supporting base 10. Therefore, not only the quantity of bare chips in the chip device may increase, but also the size of the chip device in the direction parallel to the plane of the supporting base 10 may decrease, which may effectively improve the integration degree of the chip device.

When forming the second encapsulation layer 31, the second encapsulation layer 31 may fully cover the second bare chip 60, the second connection pillar 61 and the conduction portion 70. Before performing the subsequent packaging process, the second encapsulation layer 31 and the insulating layer between the second encapsulation layer 31 and the first redistribution layer 40 may jointly protect the second bare chip 60, the second connection pillar 61 and the conduction portion 70, which may prevent external factors, e.g., water and oxygen, etc., from affecting the electrical performance of the chip device, and may facilitate storage. When performing the subsequent packaging process, the second encapsulation layer 31 may desire to be polished to expose the side surfaces of both the second connection pillar 61 and the conduction portion 70 away from the first encapsulation layer 30. Thus, the second connection pillar 61 and the conduction portion 70 may have desired electrical connection with the subsequently formed solder ball group 50.

When a height of the conduction portion 70 is different from a total height of the second bare chip 60 and the second connection pillar 61, a polishing process may be performed to enable the side surface of the conduction portion 70 to be coplanar with the side surface of the second connection pillar 61 away from the first redistribution layer 40. Therefore, a substantially flat base may be provided for subsequently formed structures, which may effectively prevent the occurrence of breakage, disconnection, etc., of the subsequent formed structure due to an uneven surface of the second encapsulation layer 31, and may facilitate improving pass rate of the chip device. The polishing process may be replaced by any other suitable process, e.g., an etching process, etc., according to practical applications, which is not limited by the present disclosure.

When forming the solder ball group 50, the third solder ball 53 of the solder ball group 50 may be electrically connected to the second connection pillar 61. At least one second connection pillar 61 on the second bare chip 60 may be led out through the third solder ball 53 to implement electrical connection between the second bare chip 60 and an external circuit, e.g., a printed circuit board, etc.

When electrically connecting the conduction portion 70 and the second redistribution element 42 in S110, the electrical connection mode between the conduction portion 70 and the second redistribution element 42 may be flexibly set according to practical applications. In one embodiment, the side surface of the second redistribution element 42 away from the first bare chip 20 may be extended to a bottom of the second encapsulation layer 31. In view of this, the conduction portion 70 may be electrically connected to the second redistribution element 42 by soldering, attaching, etc. The conduction portion 70 may be electrically connected to the second redistribution element 42 by other means. For illustrative purposes, FIGS. 27-31 illustrate the former case as an example.

The conduction portion 70 and the second bare chip 60 provided with the second connection pillar 61 may be pre-fabricated before performing the packaging process of the chip device. When subsequently performing the packaging process, the conduction portion 70 and the second bare chip 60 may desire to be placed at corresponding positions, which may facilitate improving the packaging efficiency of the chip device. In view of this, the sequence of S109 and S110 may be determined according to practical applications. For illustrative purposes, S109 is first performed, and then S110 is performed as an example. The remaining processes may refer to corresponding descriptions associated with FIGS. 14-19, which are not repeated herein.

Figure 32:
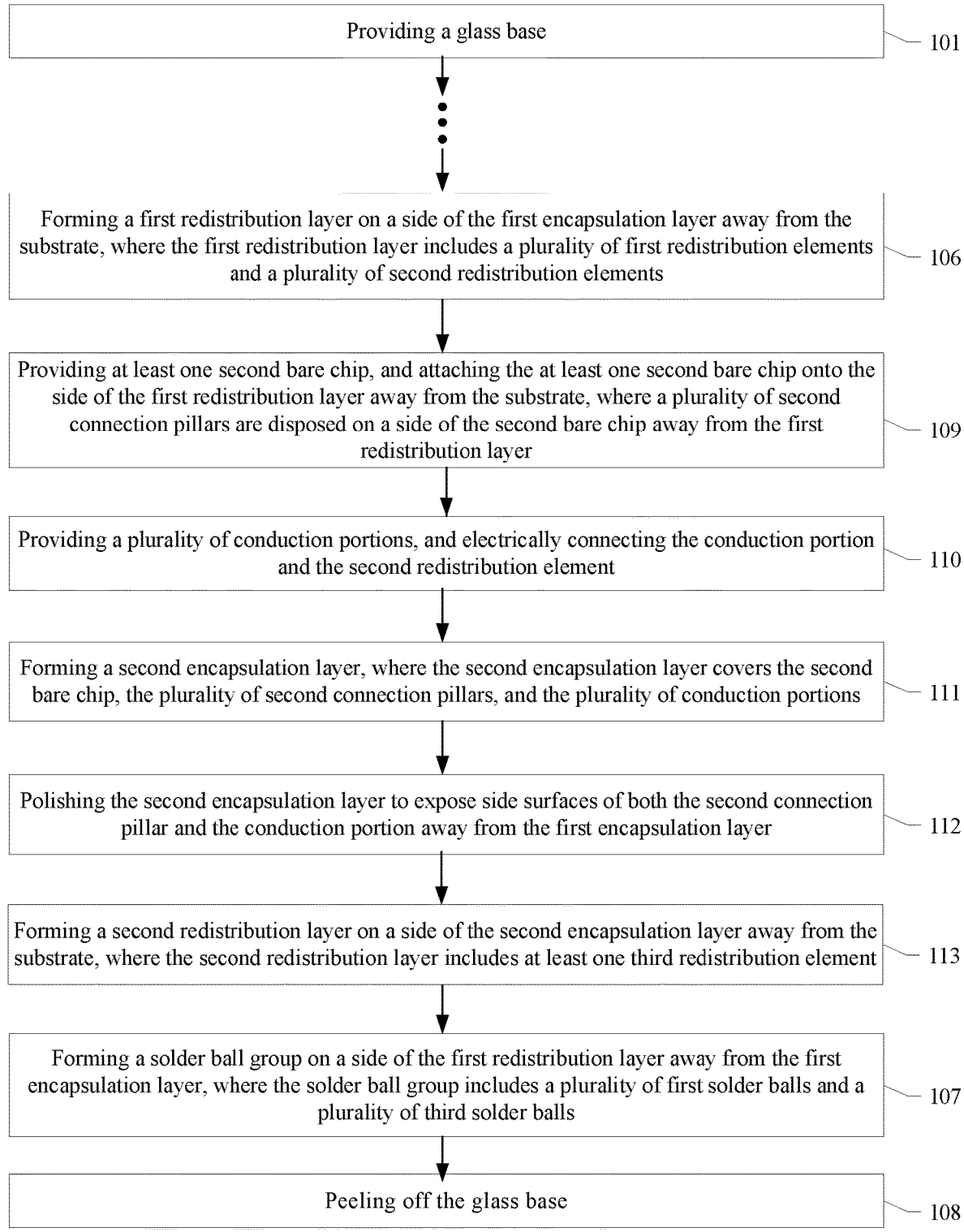
FIG. 32 illustrates a flow chart of another exemplary packaging method for forming a panel-level chip device consistent with disclosed embodiments of the present disclosure.
Figure 33:
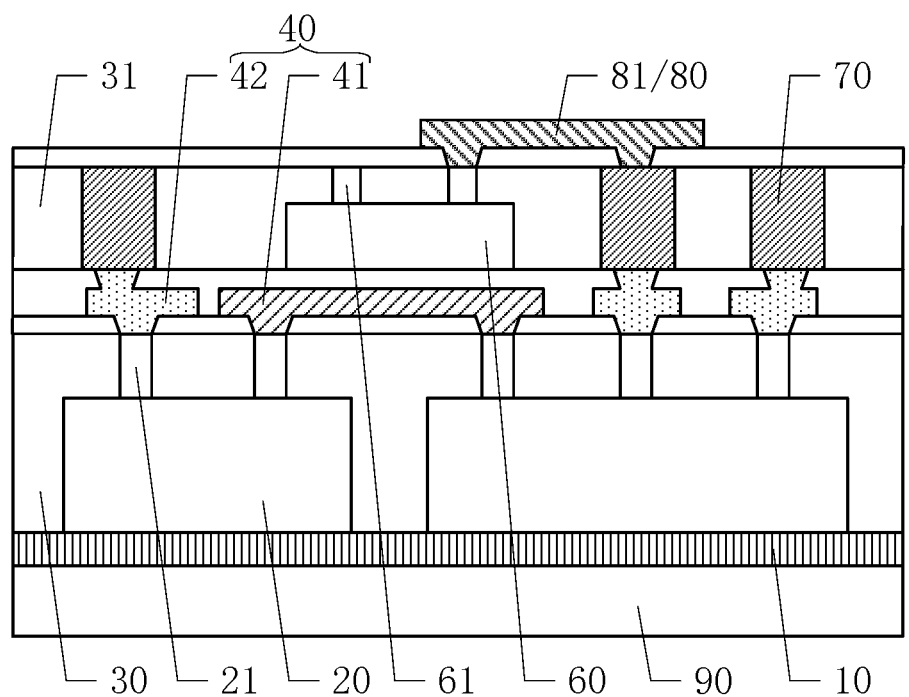
FIGS. 33-34 illustrate schematic sectional views of semiconductor structures corresponding to certain stages of an exemplary packaging method for forming a panel-level chip device in FIG. 32 consistent with disclosed embodiments of the present disclosure.
Figure 34:
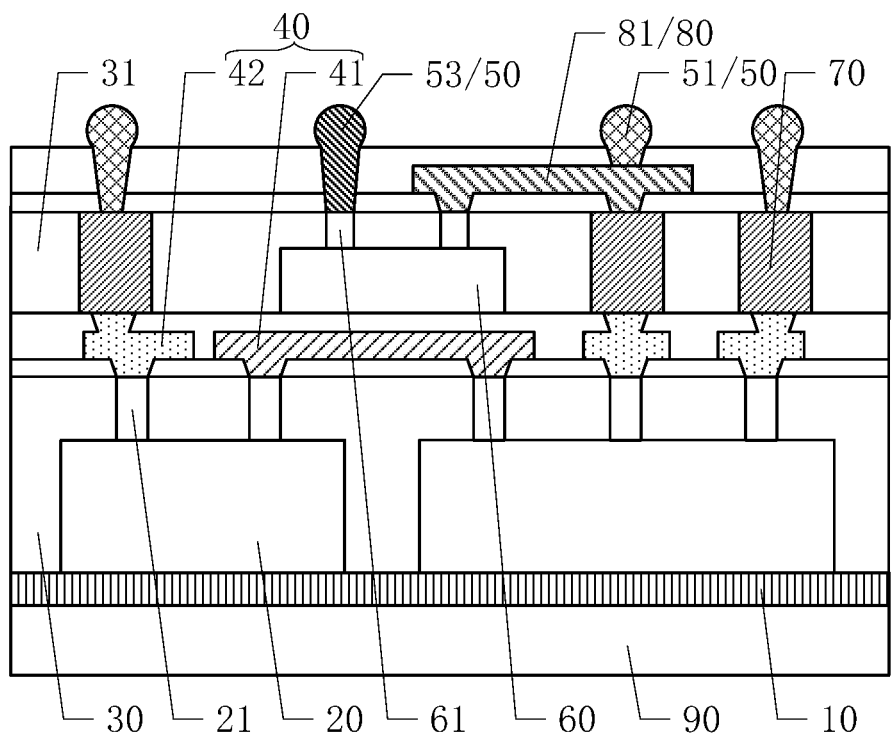

FIG. 32 illustrates a flow chart of another packaging method for forming the panel-level chip device consistent with disclosed embodiments of the present disclosure; and FIGS. 33-34 illustrate schematic sectional views of semiconductor structures corresponding to certain stages of the packaging method for forming the panel-level chip device in FIG. 32. Referring to FIG. 1, FIG. 10 and FIGS. 32-34, before forming the solder ball group 50 on the side of the first redistribution layer 40 away from the first encapsulation layer 30 in S107, the packaging method may further include the following.

S113: Forming a second redistribution layer 80 on a side of the second encapsulation layer 31 away from the supporting base. The second redistribution layer 80 may include at least one third redistribution element 81. At least one second connection pillar 61 may be electrically connected to the conduction portion 70 through the third redistribution element 81.

In one embodiment, the second connection pillar 61 may be electrically connected to the conduction portion 70 through the third redistribution element 81. Thus, the second connection pillar 61 and the conduction portion 70 may be directly led out through the first solder ball 51 or the third solder ball 53, which may facilitate reducing the quantity of solder balls of the chip device and reducing the assembly difficulty between the chip device and an external circuit, e.g., a printed circuit board, etc. At the same time, the wire layout of the chip device may be substantially flexible and convenient.

The process of forming the second redistribution layer 80 may include an electroplating process, a chemical plating process, and an etching process, etc. In a same packaging process, the second redistribution layer 80 may be formed by a same process as or a process different from the first redistribution layer 40, which is not limited by the present disclosure.

In one embodiment, referring to FIG. 1, FIG. 10 and FIGS. 32-34, the first redistribution layer 40 and the second redistribution layer 80 may be formed by one of an electroplating process and a chemical plating process.

In one embodiment, use of one of an electroplating process and a chemical plating process to form the redistribution layer may simplify the packaging process, ensure the accuracy of the wire pattern of each redistribution layer, and improve the packaging efficiency. At the same time, use of a material with a substantially low resistivity for an electroplating process or a chemical plating process may enable the formed redistribution layer to have a substantially low resistivity. Thus, the loss of electrical signal when being transmitted on the redistribution layer may be effectively reduced, and the strength of the electrical signal in the chip device may be ensured.

Optionally, before performing the electroplating process or the chemical plating process, a seed layer with a certain thickness may be formed on surface portions of the encapsulation layer corresponding to the subsequently formed redistribution elements (e.g., first redistribution elements and/or second redistribution elements) of the redistribution layer to provide a desired electrical conductivity for the elements in the redistribution layer. The process for forming the seed layer may include, but is not limited to the following. A seed layer with a desired thickness may be deposited by a physical vapor deposition, etc. Then, a photoresist may be coated on the seed layer. Predetermined patterns of the first redistribution element 41 and the second redistribution element 42, etc., as electrodes of the subsequent electroplating process or the chemical plating process, may be exposed by a photolithography process. The first redistribution element 41, the second redistribution element 42, etc., may be formed on the exposed wire patterns by the electroplating process or the chemical plating process. Ultimately, the photoresist and the seed layer covered by the photoresist may be removed. The seed layer may be made of a material including any one of copper, nickel, silver, gold and alloys thereof.

Figure 35:
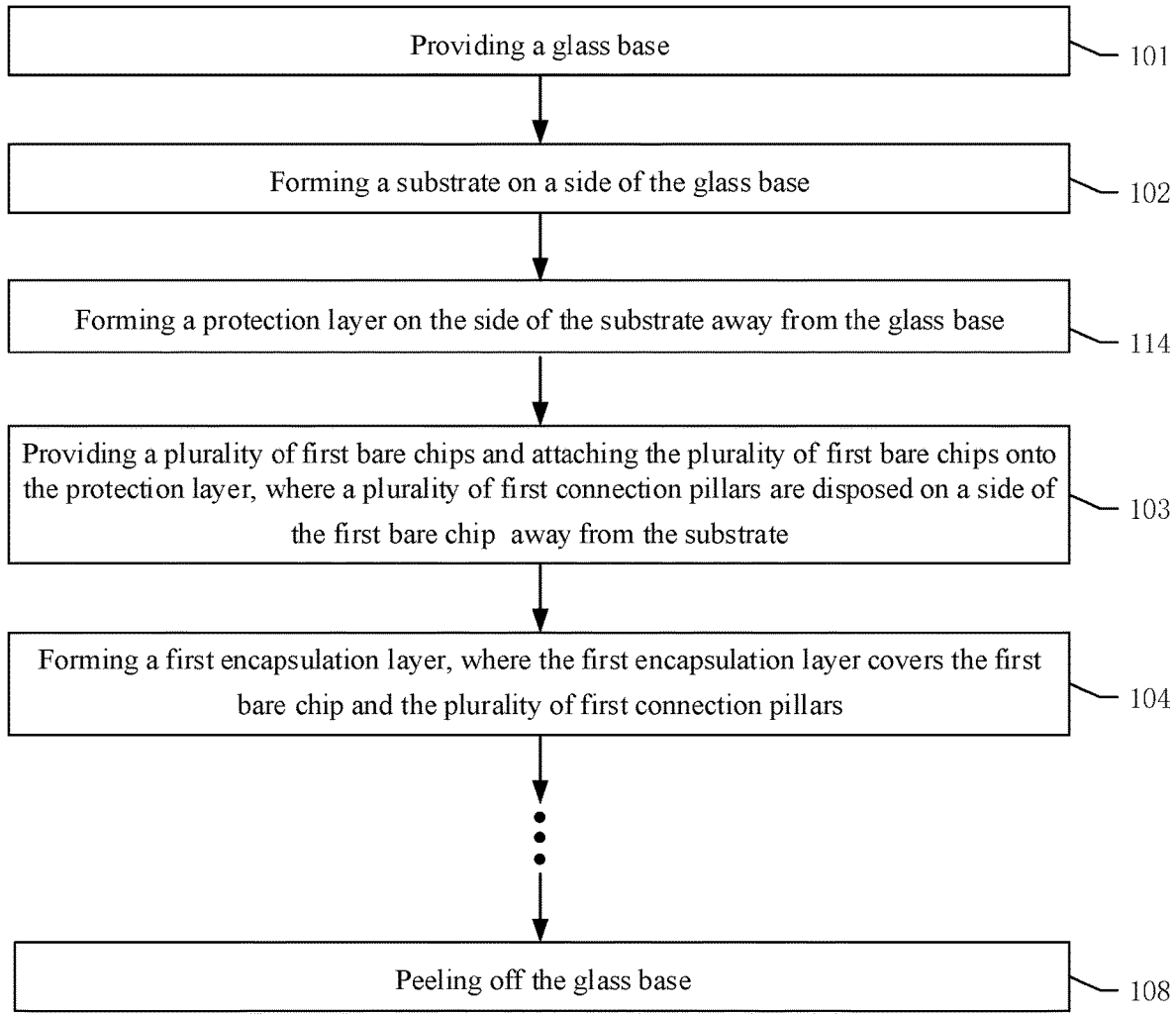
FIG. 35 illustrates a flow chart of another exemplary packaging method for forming a panel-level chip device consistent with disclosed embodiments of the present disclosure.
Figure 36:
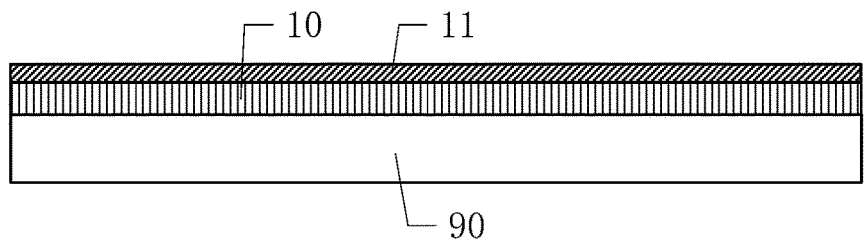
FIGS. 36-37 illustrate schematic sectional views of semiconductor structures corresponding to certain stages of an exemplary packaging method for forming a panel-level chip device in FIG. 35 consistent with disclosed embodiments of the present disclosure.
Figure 37:
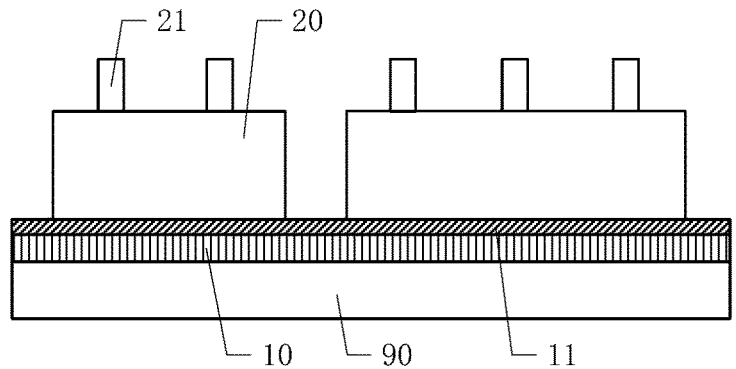

FIG. 35 illustrates a flow chart of another packaging method for forming the panel-level chip device consistent with disclosed embodiments of the present disclosure; and FIGS. 36-37 illustrate schematic sectional views of semiconductor structures corresponding to certain stages of the packaging method for forming the panel-level chip device in FIG. 35. In one embodiment, referring to FIG. 1, FIG. 12 and FIGS. 35-37, before providing the plurality of first bare chips 20 in S103, the packaging method may further include the following.

S114: Forming a protection layer 11 on the side of the supporting base 10 away from the glass substrate 90.

When providing the plurality of first bare chips 20, the first bare chip 20 may be attached onto the protection layer 11. In one embodiment, the protection layer 11 may be formed before attaching the first bare chip 20. On the one hand, the protection layer 11 may effectively block the high temperature used for forming the first encapsulation layer 30 by the molding packaging process, and may effectively protect the supporting base 10. On the other hand, in a case of poor sealing property of the supporting base 10, the formed protection layer 11 may effectively prevent the external water and oxygen from penetrating into the chip device through the supporting base 10, and, thus, the chip device may have desired electrical performance. In view of this, the protection layer 11 may be made of a material having high temperature resistance and desired sealing property, e.g., silicide, etc. The protection layer may be directly formed on the surface of the supporting base 10 by a coating process, etc., which may facilitate reducing difficulty of the packaging process of the chip device and improving the production efficiency of the electronic product. The remaining processes may refer to corresponding descriptions associated with FIGS. 14, 17-20, which are not repeated herein.

Figure 38:
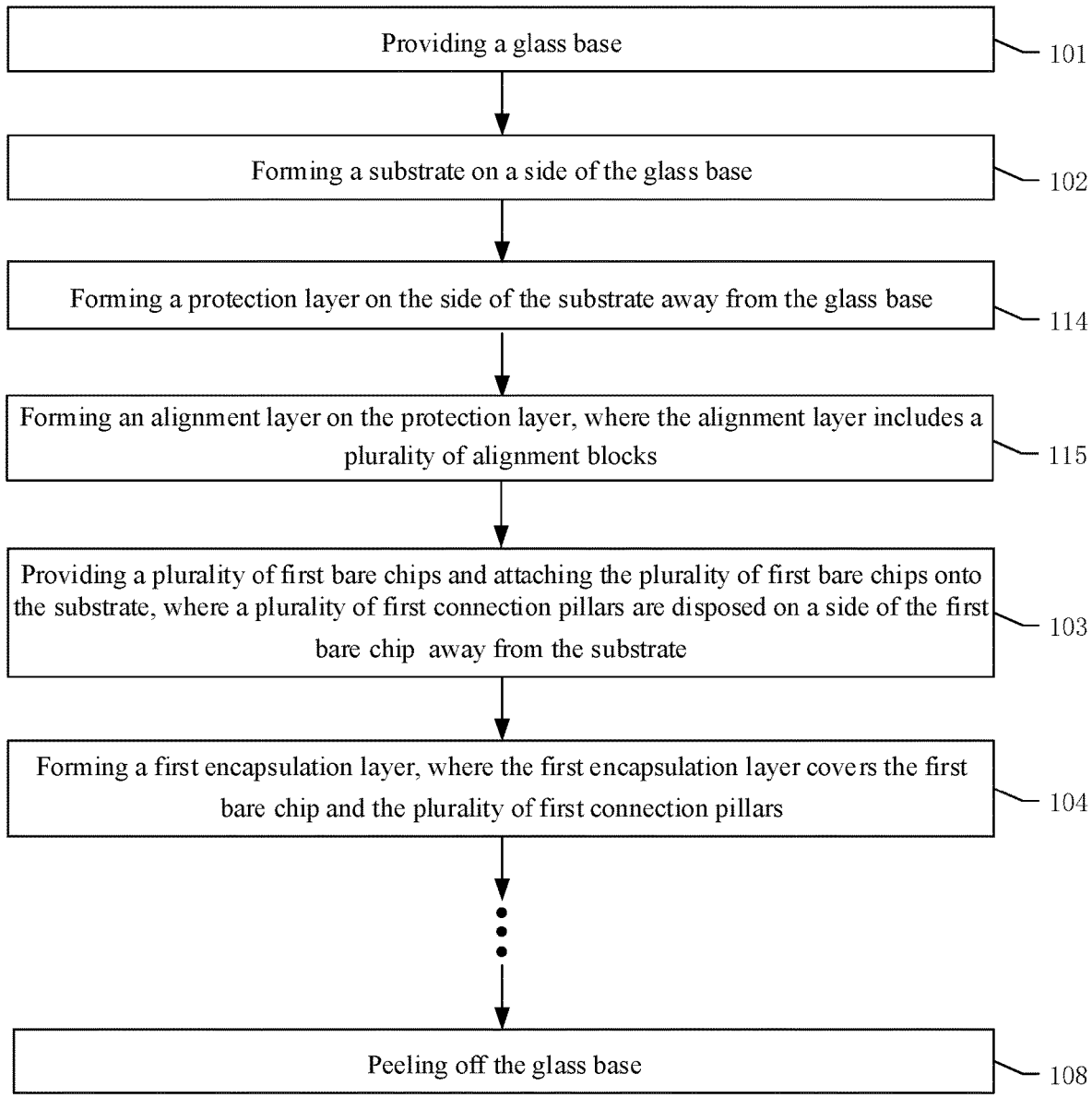
FIG. 38 illustrates a flow chart of another exemplary packaging method for forming a panel-level chip device consistent with disclosed embodiments of the present disclosure.
Figure 39:
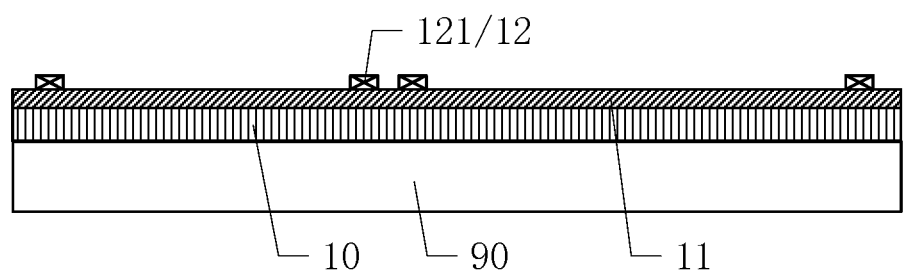
FIGS. 39-40 illustrate schematic sectional views of semiconductor structures corresponding to certain stages of an exemplary packaging method for forming a panel-level chip device in FIG. 38 consistent with disclosed embodiments of the present disclosure.
Figure 40:
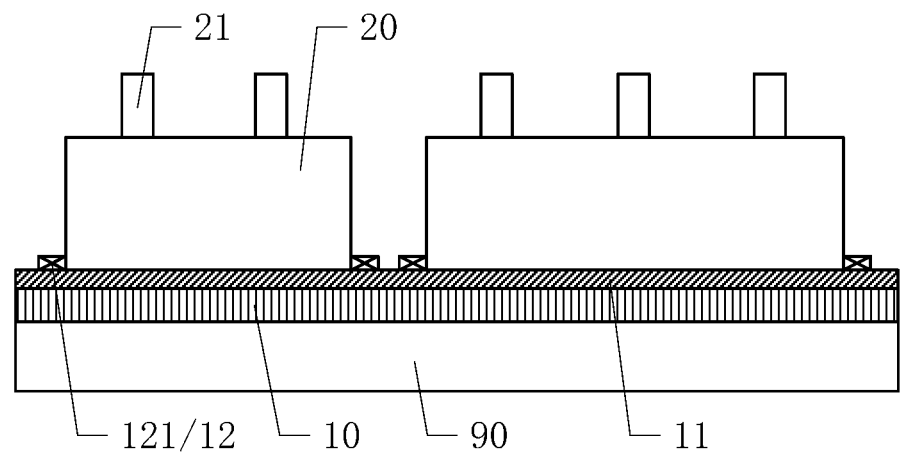

FIG. 38 illustrates a flow chart of another packaging method for forming the panel-level chip device consistent with disclosed embodiments of the present disclosure; and FIGS. 39-40 illustrate schematic sectional views of semiconductor structures corresponding to certain stages of the packaging method for forming the panel-level chip device in FIG. 38. In one embodiment, referring to FIG. 1, FIG. 12 and FIGS. 38-40, before providing the plurality of first bare chips 20 in S103, the packaging method may further include the following.

S115: Forming an alignment layer 12 on the protection layer 11. The alignment layer 12 may include a plurality of alignment blocks 121. When providing the plurality of first bare chips 20 in S103, the first bare chip 20 may be secured on surface of the protection layer 11 by the alignment block 121.

In one embodiment, when attaching the first bare chip 20 onto the protection layer 11, by disposing the alignment layer 12 in advance, each first bare chip 20 may be accurately aligned on the protection layer 11, which may facilitate improving the accuracy of the packaging efficiency, and may facilitate the attaching operation. When subsequently forming the first encapsulation layer 30, the alignment blocks 121 in the alignment layer 12 may be retained or removed, which is not limited by the present disclosure. The remaining processes may refer to corresponding descriptions associated with FIGS. 14, 17-20, which are not repeated herein.

In certain embodiments, when the protection layer 11 is not formed on the supporting base 10, the alignment layer 12 may be directly formed on the side of the supporting base 10 away from the glass substrate 90, and then the attaching operation of the first bare chip 20 may be performed to improve the accuracy of the packaging process.

In the disclosed panel-level chip device and the packaging method, the first connection pillars having the same electrical signal on the first bare chip may be electrically connected to each other through the first redistribution element. The remaining first connection pillars may be led out through the second redistribution elements, respectively, to transmit electrical signals with the external circuit. In other words, the first redistribution layer may directly connect the first connection pillars that desire to be electrically connected to each other inside the chip device, and may lead out the first connection pillars that desire to be connected to an external circuit for providing electrical signals by the first solder balls.

On the one hand, the quantity of the solder balls in the chip device may be reduced, and the assembly difficulty between the chip device and the external circuit, e.g., the printed circuit board, etc., may be reduced. Thus, the reliability of the connection between the solder balls and the external circuit may be effectively ensured, malfunction phenomena of the electronic product caused by the short-circuit issue between solder balls may be reduced, and the production efficiency of electronic product may be improved. On the other hand, the layout complexity of external wires and the power consumption of the electronic product may be reduced, and the space occupied by the external wires in the electronic product may be effectively reduced, which may enable the electronic product to be developed toward miniaturization. In addition, the chip device may be packaged on a basis of the supporting base, and, thus, the conventional post injection molding process may be eliminated. Therefore, the packaging efficiency of the chip device may be effectively improved, and the production efficiency of the electronic product may be further improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A panel-level chip device, comprising:
a plurality of first bare chips disposed on a supporting base;
a plurality of first connection pillars disposed on a side of a first bare chip of the plurality of first bare chips away from the supporting base;
a first encapsulation layer, wherein the first encapsulation layer covers the first bare chip and the plurality of first connection pillars, and exposes a side surface of a first connection pillar of the plurality of first connection pillars away from the first bare chip;
a first redistribution layer, disposed on a side of the first encapsulation layer away from the supporting base, wherein the first redistribution layer includes a plurality of first redistribution elements and a plurality of second redistribution elements; and
a solder ball group, disposed on a side of the first redistribution layer away from the first encapsulation layer, wherein the solder ball group includes a plurality of first solder balls,
wherein:
first connection pillars in the plurality of the first connection pillars having a same electrical signal are electrically connected to each other by a first redistribution element of the plurality of first redistribution elements, and
each of remaining first connection pillars in the plurality of the first connection pillars is electrically connected to one second redistribution element of the plurality of second redistribution elements, the one second redistribution element further being electrically connected to a first solder ball of the plurality of first solder balls.

2. The panel-level chip device according to claim 1, wherein:
the first redistribution element includes at least one first wire portion and at least one second wire portion, wherein:
a second wire portion of the at least one second wire portion is disposed on a side of a first wire portion of the at least one first wire portion away from the first encapsulation layer,
the second wire portion is electrically connected to the first wire portion, and
the first wire portion is electrically connected to the first connection pillar.

3. The panel-level chip device according to claim 2, wherein:
the first redistribution element includes at least two first wire portions; and
the second wire portion bridges the at least two first wire portions.

4. The panel-level chip device according to claim 1, wherein:
the solder ball group further includes a plurality of second solder balls, and
at least one first redistribution element of the plurality of first redistribution elements is electrically connected to at least one second solder ball of the plurality of second solder balls.

5. The panel-level chip device according to claim 4, wherein:
a total quantity of the plurality of first solder balls and the plurality of second solder balls is m1, and
a quantity of the plurality of first connection pillars is m2, wherein m1<m2.

6. The panel-level chip device according to claim 1, further including:
at least one second bare chip, wherein a second bare chip of the at least one second bare chip is disposed on a side of the solder ball group near the first redistribution layer, and a plurality of second connection pillars are disposed on a side of the second bare chip away from the first redistribution layer;
a plurality of conduction portions, wherein a conduction portion of the plurality of conduction portions is disposed on a side of the second redistribution element away from the first encapsulation layer, and the second redistribution element is electrically connected to the first solder ball through the conduction portion; and
a second encapsulation layer, wherein the second encapsulation layer covers the second bare chip, the plurality of second connection pillars and the plurality of conduction portions, and exposes side surfaces of both a second connection pillar of the plurality of second connection pillars and the conduction portion away from the first encapsulation layer,
wherein:
the solder ball group further includes a plurality of third solder balls, and
at least one second connection pillar of the plurality of second connection pillars is electrically connected to a third solder ball of the plurality of third solder balls.

7. The panel-level chip device according to claim 6, further including:
a second redistribution layer, wherein:
the second redistribution layer is disposed between the second encapsulation layer and the solder ball group,
the second redistribution layer includes at least one third redistribution element, and
the at least one second connection pillar is electrically connected to the conduction portion through a third redistribution element of the at least one third redistribution element.

8. The panel-level chip device according to claim 6, wherein:
a total quantity of the plurality of first solder balls and the plurality of third solder balls is n1; and
a total quantity of the plurality of first connection pillars and the plurality of second connection pillars is n2, wherein n1<n2.

9. The panel-level chip device according to claim 1, wherein:
the supporting base is a flexible supporting base, wherein the flexible supporting base is made of a material including at least one of polyimide, polypropylene resin, and acrylic resin.

10. The panel-level chip device according to claim 1, further including:
a protection layer, disposed between the supporting base and the plurality of first bare chips.

* * * * *